United States Patent
Kitani et al.

[11] Patent Number: 6,118,289
[45] Date of Patent: Sep. 12, 2000

[54] CLEANING METHOD AND CLEANING DEVICE AND CLEANING TOOL FOR BOARD ELECTRICAL-TEST PROBES, AND BOARD ELECTRICAL-TEST DEVICE AND METHOD

[75] Inventors: Masashi Kitani; Kunio Satomi, both of Yokohama; Shigeo Kikuchi, Ushiku, all of Japan

[73] Assignee: Canon Kabushiki Kaisha, Tokyo, Japan

[21] Appl. No.: 09/037,008

[22] Filed: Mar. 9, 1998

[30] Foreign Application Priority Data

| Mar. 10, 1997 | [JP] | Japan | 9-055110 |
| Jun. 18, 1997 | [JP] | Japan | 9-161600 |
| Jun. 18, 1997 | [JP] | Japan | 9-161601 |

[51] Int. Cl.$^7$ ........................................... B08B 1/00

[52] U.S. Cl. ................... 324/754; 324/761; 434/6

[58] Field of Search ............................ 209/900, 573, 209/564; 324/754, 158; 134/6, 16

[56] References Cited

U.S. PATENT DOCUMENTS

| 4,401,237 | 8/1983 | Smith | 222/56 |
| 5,680,936 | 10/1997 | Beers | 209/564 |
| 5,820,688 | 10/1998 | Koppl et al. | 134/2 |
| 5,968,282 | 10/1999 | Yamasaka | 134/6 |

FOREIGN PATENT DOCUMENTS

| 0 372 666 | 6/1990 | European Pat. Off. . |
| 7-128368 | 5/1995 | Japan . |
| 7-244074 | 9/1995 | Japan . |

*Primary Examiner*—Safet Metjahic
*Assistant Examiner*—Vincent Q. Nguyen
*Attorney, Agent, or Firm*—Fitzpatrick, Cella, Harper & Scinto

[57] ABSTRACT

To securely clean dirty material deposited on ends of board electrical-test probes used in a board test device for executing tests including an incircuit test by a cleaning job executed once, the extreme ends of the contact pins of the board electrical-test probes are pierced through an elastic sheet molded by dispersing fine metal oxide particles dispersed therein in a specific weight percentage amount and then pulled out from the elastic sheet.

22 Claims, 21 Drawing Sheets

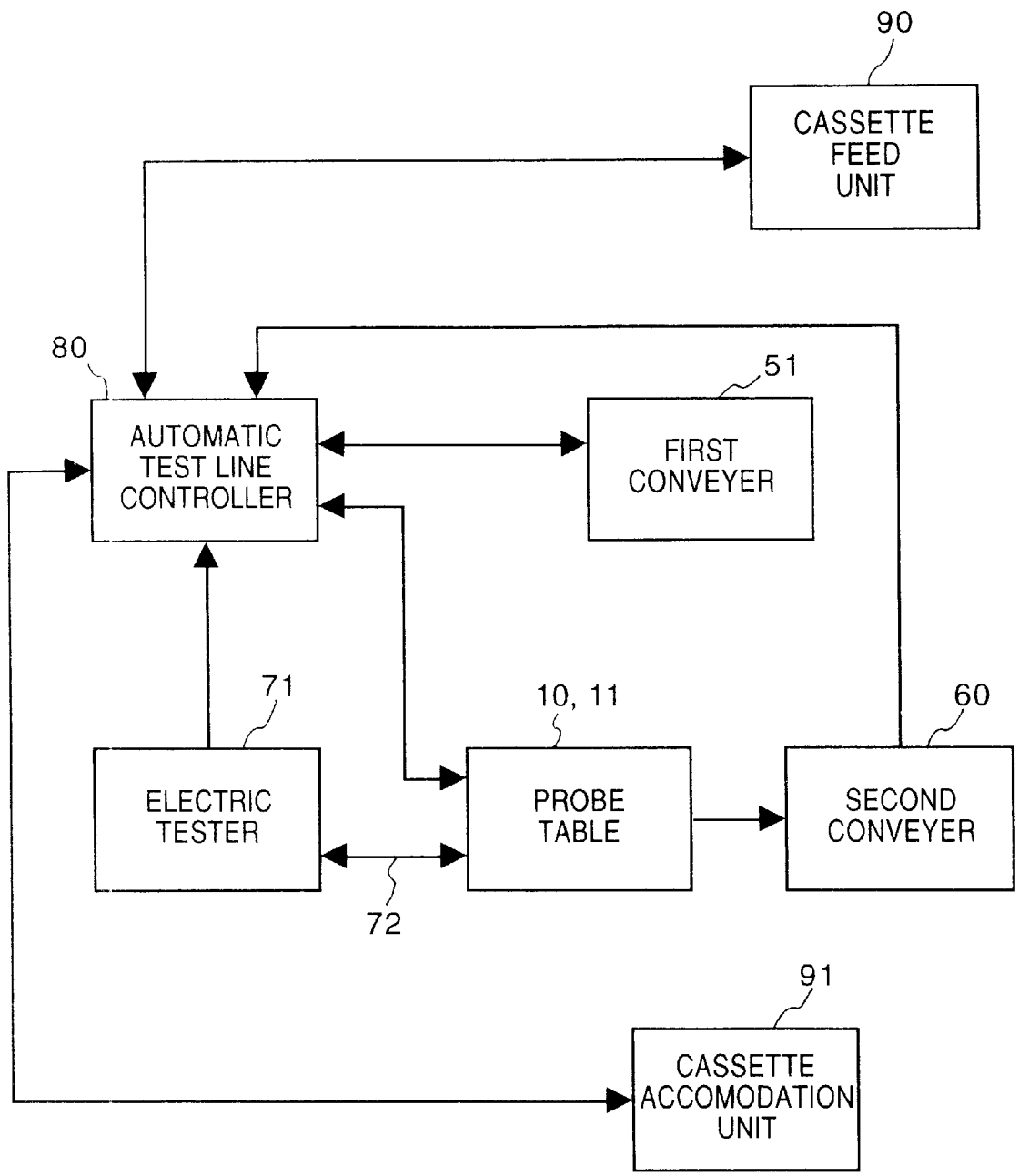
F I G. 14

CLEANING METHOD AND CLEANING DEVICE AND CLEANING TOOL FOR BOARD ELECTRICAL-TEST PROBES, AND BOARD ELECTRICAL-TEST DEVICE AND METHOD

BACKGROUND OF THE INVENTION

The present invention relates to a cleaning method and a cleaning device and a cleaning tool for board electrical-test probes, and more specifically, to a technology for removing the dirt deposited to the extreme ends of the contact pins, which come into direct contact with the conductor patterns on a printed circuit board, of the electrical-test probes used in a test device which is used to test the electrically mounted state of electronic parts such as, for example, ICs, resistors, capacitors and the like of the printed circuit board after they are soldered thereon.

Conventionally, a surface mount technology of electronic parts to a printed circuit board includes a so-called STM method of reflow soldering electronic parts by printing cream solder and a soldering method of blowing solder to the printed circuit board on which electronic parts are mounted using a solder flow vessel. However, any of the methods employs chlorofluorocarbon or 1,1,1-trichloroethane to wash and remove solder flux used in the soldering from the surface where the electric parts are soldered.

However, it is found that a reason for causing the recent environmental pollution attributes to the use of chlorofluorocarbon or 1,1,1-trichloroethane, thus requiring the use of it to be refrained. To cope with this problem, the improvement of the physical property and corrosiveness of the flux is proceeded to make it unnecessary to wash it. Further, manufacturers positively struggle to use a cleaning agent which causes no environmental pollution or makes the cleaning and removal of the flux with water.

However, since it is conceived that the use of the cleaning agent or water may cause different environmental pollution, a best way at present is to make the cleaning of the flux unnecessary, which is also favorable from the viewpoint of cost reduction.

However, there is known a problem that when the flux is not cleaned, since it is deposited to the contact pins used in an electrical test performed after soldering and gradually grown, conductivity failure may be caused in the electrical test.

FIG. 19 is a flowchart for mounting electronic parts on a printed circuit board and shows steps for mounting the parts on the printed circuit board 30 and shipping it.

In the drawing, a printed circuit board 30 is prepared at step S1 and cream solder is printed at step S2. Thereafter, surface mounting electronic parts 31 are mounted by a mounter or the like and reflow soldering is carried out at step S4. Thereafter, an incircuit test is effected at next step S5 without cleaning flux produced by the soldering and only a board passed the incircuit test is subjected to a function test at subsequent step S6 and a board passed the test is shipped (step S7).

Otherwise, the process goes to step S8 after step S1 where the electronic parts 31 are mounted by being inserted into mounting sections including parts mounting through holes, thereafter the electronic parts 31 are soldered using a solder reflow vessel at step S9, subjected to an incircuit test at step S10 and only a board passed the test is subjected to a function test at subsequent step S11 and only a board passed the test is shipped (S7).

FIG. 20 is an outward appearance perspective view of an incircuit tester used at steps S5 and S10 and shows the main portion of prior art board electrical-test probes in cross section and FIG. 21 is an enlarged view of the main portion thereof.

In FIG. 20 and FIG. 21, a plurality of probes 4 are arranged such that the contact pins 5 thereof are positioned to the solder fillets at the extreme ends of QFP (quad flat package) leads mounted to the printed circuit board 30. The probes 4 execute the incircuit test (steps S5 and S10 in FIG. 19), after electronic parts are mounted, by maintaining electric conductivity by moving the contact pins 5 upward or downward so that they are abutted against the solder fillets at the extreme ends of the QFP leads of a quad flat package (QFP) as an IC package.

Recently, as a surface mount density is increased, since it becomes difficult to obtain a space for disposing test pads to which the contact pins 5 of the test probes 4 are dropped, the test contact pins 5 cannot help being dropped to a limited region where flux F is thickly left when solder flows over and over again, the region corresponding to the solder fillet portion at the extreme end of the lead of the QFP package, the solder fillet portion of the soldering land portion (not shown) of chip parts and the like. As a result, since the flux F is still more deposited than ever at the extreme end of the test contact pin 5 as shown in FIG. 21, conductivity failure is liable to occur when the incircuit test is carried out.

The occurrence of the conductivity failure is characterized in that when the conductivity failure occurs once, although the flux F may be removed by repeatedly dropping the contact pin 5 twice or thrice, the method of removing the flux F by moving the contact pin many times cannot be employed because it is unstable. Thus, when the conductivity failure occurs once, parts which must be intrinsically accepted because no soldering failure and no device failure occurs to them are erroneously rejected.

As a result, the efficiency of a production line is greatly lowered. It is an ordinary practice to cope with this problem that when failure which seems to be caused by the dirt deposited to the extreme ends of the contact pins 5 often occurs, the contact pins 5 are directed upward by turning an upper plate 10 on which test probes 4 are disposed about 180° in the direction of an arrow K and the flux F deposited to contact pins in the vicinity of the portion where the failure occurs is cleaned with a brush or the like and then the test is resumed. In addition, as to the contact pins 5 disposed to a lower plate 11, the flux F deposited to contact pins in the vicinity of the portion where failure occurs is cleaned with the brush or the like likewise.

SUMMARY OF THE INVENTION

However, when the flux is cleaned with the brush as described above, since cleaning is differently effected depending upon a worker and cannot be carried out uniformly, it cannot be ensured that dirty material by which conductivity failure is caused is securely removed after the cleaning.

When it is confirmed by the test effected after the cleaning that conductivity failure still occurs, there is a very troublesome problem that the cleaning must be carried out again.

Recently, since the number of the contact pins 5 of the probes 4 of a tester often exceeds 1000 pieces and sometimes exceeds 2000 pieces to cope with the increase of the circuit scale of printed circuit boards, there is a problem that the cleaning carried out using the brush requires much expense in time and effort. In addition, in the flowchart shown in FIG. 19, the respective processes from step S1 to step S11 are automatically carried out. Namely, the plurality of printed circuit boards 30 are prepared at step S1 and the cream solder is printed thereto while they are automatically conveyed on an automatic line, chip parts or devices as surface mount parts are placed and tentatively bonded to the specific positions of the printed circuit board 30 by the chip mounter at step S3, soldered with dissolved solder in a reflow process (step S4) and subjected to an incircuit test and a function test (steps S5, S6) without cleaning flux F and then only accepted printed circuit boards are shipped (step S7).

Otherwise, after soldering is carried out in the solder flow vessel (step S9), the incircuit test and the function test are carried out (steps S10, S11) and only accepted printed circuit boards are shipped (step S7).

In the automatic line as described above, only the cleaning job of the contact pins 5 of the probes 4 of the tester which is effected using the brush in the incircuit test (steps S5, S10) prevents the full-automation of the line. That is, it is substantially impossible to automatically operate the process for cleaning all the probes of 1000 to 2000 pieces after the upper plate 10 is turned 180° in FIG. 20. Even if the process can be automated, there is a problem that the automation of the process can be realized only in a very large scale.

When the cleaning of the flux is carried out with the brush, since cleaning is differently effected depending upon a worker and cannot be carried out uniformly, it cannot be ensured that a dirty material by which conductivity failure is caused is securely removed after the cleaning.

When it is confirmed by the test effected after the cleaning that conductivity failure still occurs, there is a very troublesome problem that the cleaning must be carried out again.

Accordingly, an object of the present invention made in consideration of the above problems is to provide a cleaning method and cleaning device and cleaning tool for a board electrical-test probes and a board electrical-test device and method which can securely clean by a cleaning job carried out once the dirt deposited to the extreme ends of the contact pins of a board electrical-test probes which are used to a board tester for effecting tests including an incircuit test.

Another object of the present invention is to provide a board electrical-test method, a board electrical-test device and cleaning effected when a board is electrically tested by which the dirty material deposited to the extreme ends of the contact pins of board electrical-test probes, which are used in the board electrical-test device for carrying out tests including an incircuit test, can be cleaned by a cleaning job carried out once by making use of the moving operation of the board electrical-test probes.

Still another object of the present invention is to provide a board electrical-test method, a board electrical-test device and cleaning effected when a board is electrically tested which permit a board manufacturing line in which flux is not cleaned to be fully automated.

A further object of the present invention is to provide a board electrical-test method, a board electrical-test device and a cleaning tool used when a board is electrically cleaned, by which it can be ensured that an elastic sheet is within the limit of use when it is used to clean the dirty material deposited to the extreme ends of the contact pins of board electrical-test probes by a cleaning job carried out once by making use of the moving operation of the board electrical-test probes.

In addition to the above, a still further object of the present invention is to provide a board electrical-test method, a board electrical-test device and a cleaning tool used when a board is electrically tested, by which the full-automation of a board manufacturing line in which flux is not cleaned can easily achieved.

To achieve the above objects by solving the aforesaid problems, there are provided board electrical-test probes and a cleaning tool which are used in a board electrical-test device for executing tests including an incircuit test and they are characterized in that the extreme ends of the contact pins of the board electrical-test probes are pierced to an elastic sheet in which fine metal oxide particles are dispersed in the amount of a specific weight percent, a dirty material including solder flux deposited to the extreme ends of the contact pins is securely captured in the elastic sheet and the contact pins can be used again after they are pulled out from the elastic sheet.

Further, there is provided a board electrical-test method of executing the electrical test of boards including an incircuit test, the method comprising a conveying process for sequentially conveying the boards downstream one by one with the parts mounted thereon facing outward; an electrical test method of executing the electrical test by positioning the boards while they are conveyed in the conveying process and moving electrical-test probes for the electrical test so that the extreme ends of the contact pins of the probes come into direct contact with the surfaces of the boards where the parts are mounted; and a cleaning process for making use of the moving action of the extreme ends of the contact pins to securely capture a dirty material including solder flux deposited to the extreme ends of the contact pins in an elastic sheet by piercing the extreme ends of contact to the elastic sheet which is molded by dispersing fine metal oxide particles in the amount of a specific weight percent therein and to pull out the extreme ends of the contact pins from the elastic sheet thereafter.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 14 is a block diagram of FIG. 13;

DESCRIPTION OF THE PREFERRED EMBODIMENT

Figure 1:
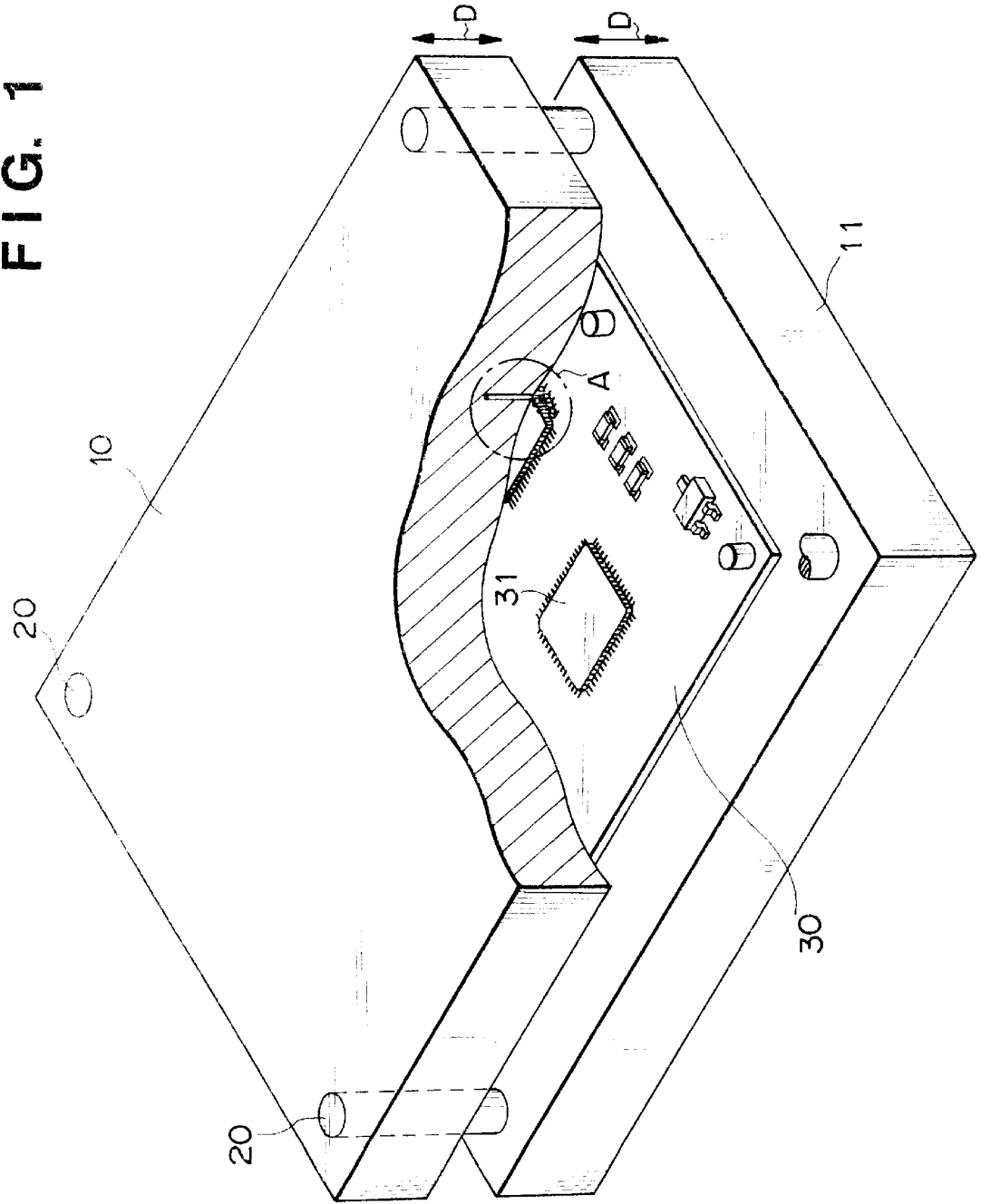
FIG. 1 is an outward appearance perspective view of a board test jig.

Preferred embodiments of the present invention will be described below with reference to the accompanying drawings. FIG. 1 is an outward appearance perspective view showing the board electrical-test probes of a test jig in an incircuit tester with the main portion thereof in cross section.

Figure 2:
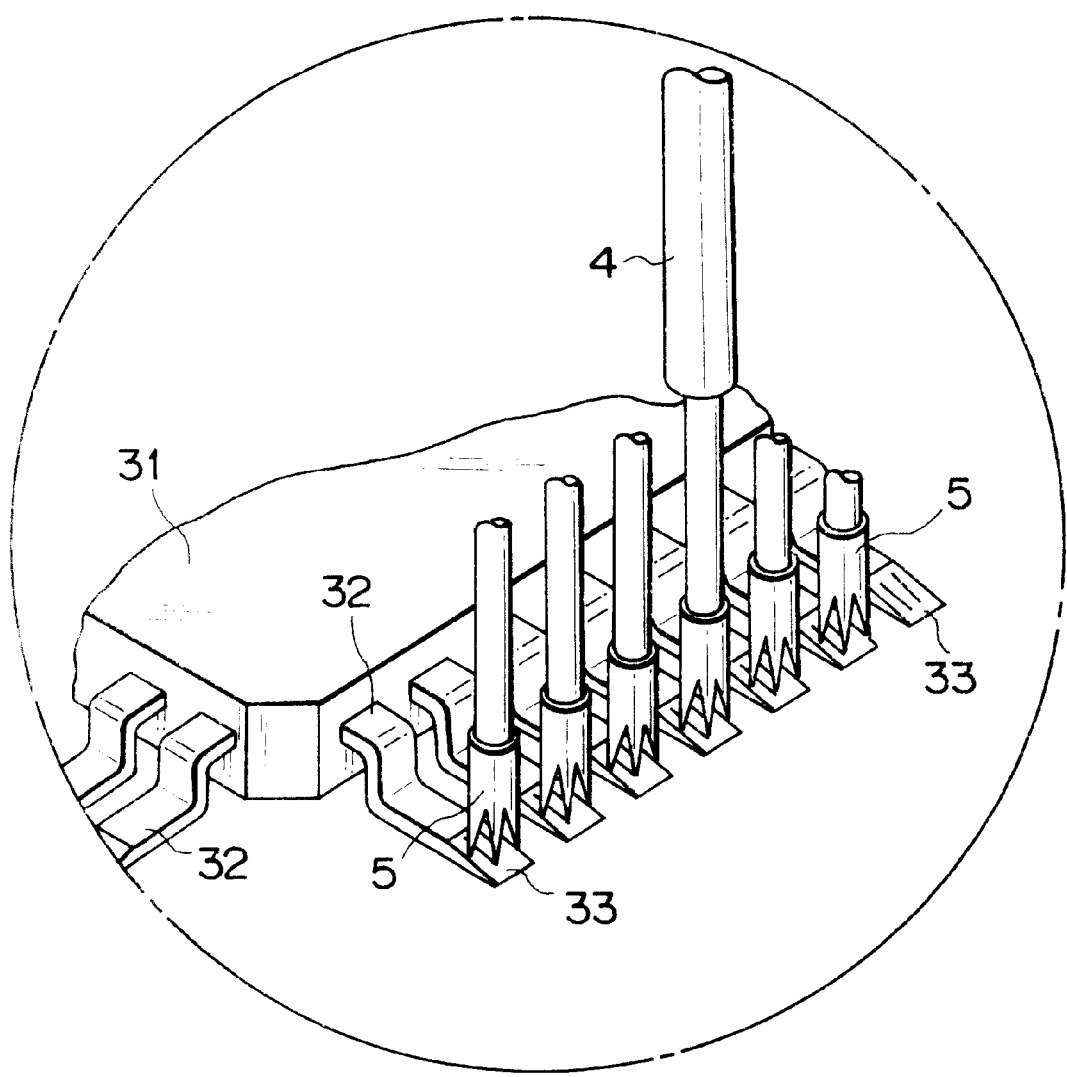
FIG. 2 is an enlarged outward appearance perspective view of the main portion of FIG. 1.

FIG. 2 is an enlarged view of the main portion of FIG. 1.

In FIGS. 1 and 2, a plurality of probes 4 are disposed to an upper plate 10 and the contact pins 5 of the probes 4 are located so as to confront the solder fillets 33 at the extreme ends of QFP leads 32 mounted on a printed circuit board 30. A plurality of probes 4 (not shown) are also disposed to a lower plate 11 likewise and the contact pins 5 thereof are located so as to the solder fillets 33 at the extreme ends of the leads of electronic parts mounted on the back surface of the board 30.

The incircuit test (steps S5, S10 in FIG. 19) is carried out after the surface mount of parts in such a manner that an urging force is generated by a coil spring which is incorporated in the probe 4 and compressed by the movement of the upper plate 10 and the lower plate 11 arranged as described above along guides 20 in the direction of an arrow D; and the urging force permits the sharp extreme end of the contact pin 5 to break flux F remaining on the solder fillet 33 because it is not cleaned and securely come into contact with the solder fillet 33 at the extreme end of the QFP lead 32 of an IC package so that electric conductivity can be secured therebetween. Further, the printed circuit board 30 is positioned by guide pins so that each probe 4 is located on each solder fillet 33. The incircuit tester is approximately arranged as described above.

Next, how a cleaning sheet 1 which is the most eminent feature of the present invention is arranged will be described.

Figure 3:
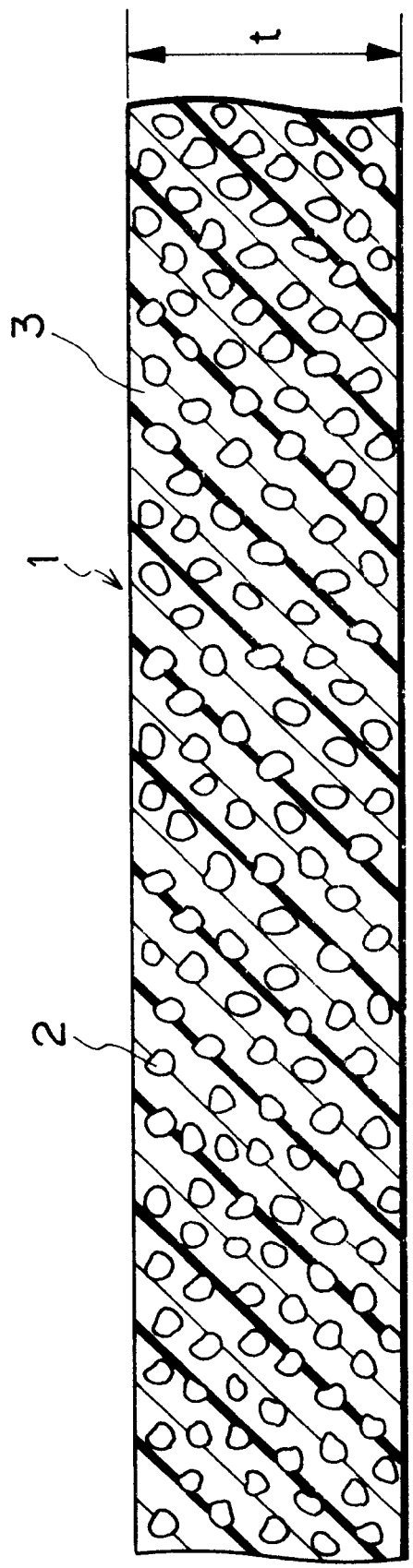
FIG. 3 is a sectional view of a cleaning sheet 1.

FIG. 3 is a sectional view of the cleaning sheet 1. In the drawing, the cleaning sheet 1 is molded to a sheet shape from an industrial rubber material containing silicone elastomer and having a rubber hardness of 20°–80° (Hs Shore A Scale) and has a thickness t (about 1 mm) so that only the extreme end of the contact pin 5 of the probe 4 can pierce it. The area of cleaning sheet 1 is as large as that of the printed circuit board 30 or set to cover at least the entire region where the probes 4 are disposed. The hardness of the cleaning sheet 1 is set to the rubber hardness of 20°–80° so that it has a restoring force after only the extreme end of the contact pin 5 pierces it.

As shown in the drawing, randomly-shaped metal oxide particles composed of aluminum oxide or magnesium oxide having a particle size of the range within 10–40 microns are uniformly dispersed in the rubber molded portion 3 of the cleaning sheet 1 in the amount of 40–70 wt %. The above arrangement of the cleaning sheet 1 permits it to be used repeatedly.

Figure 4:
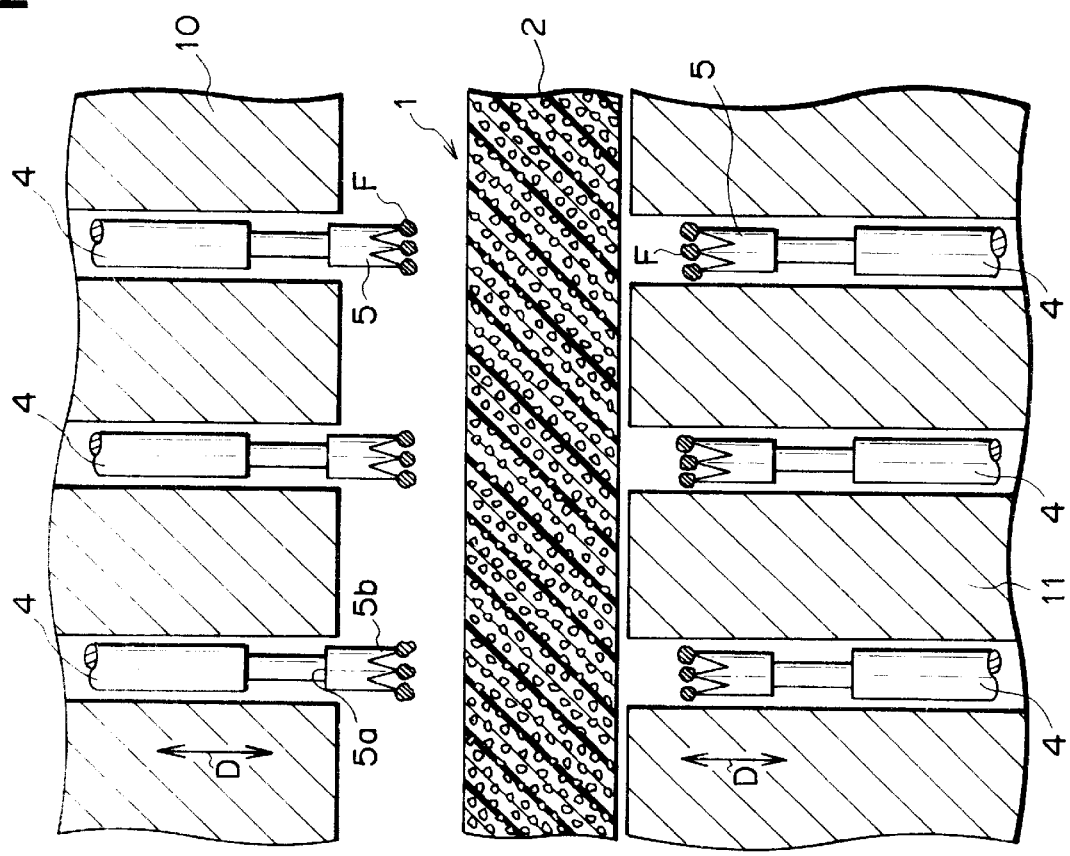
FIG. 4 is a view describing operation for cleaning the extreme ends of contact pins 5 by the cleaning sheet 1.
Figure 5:
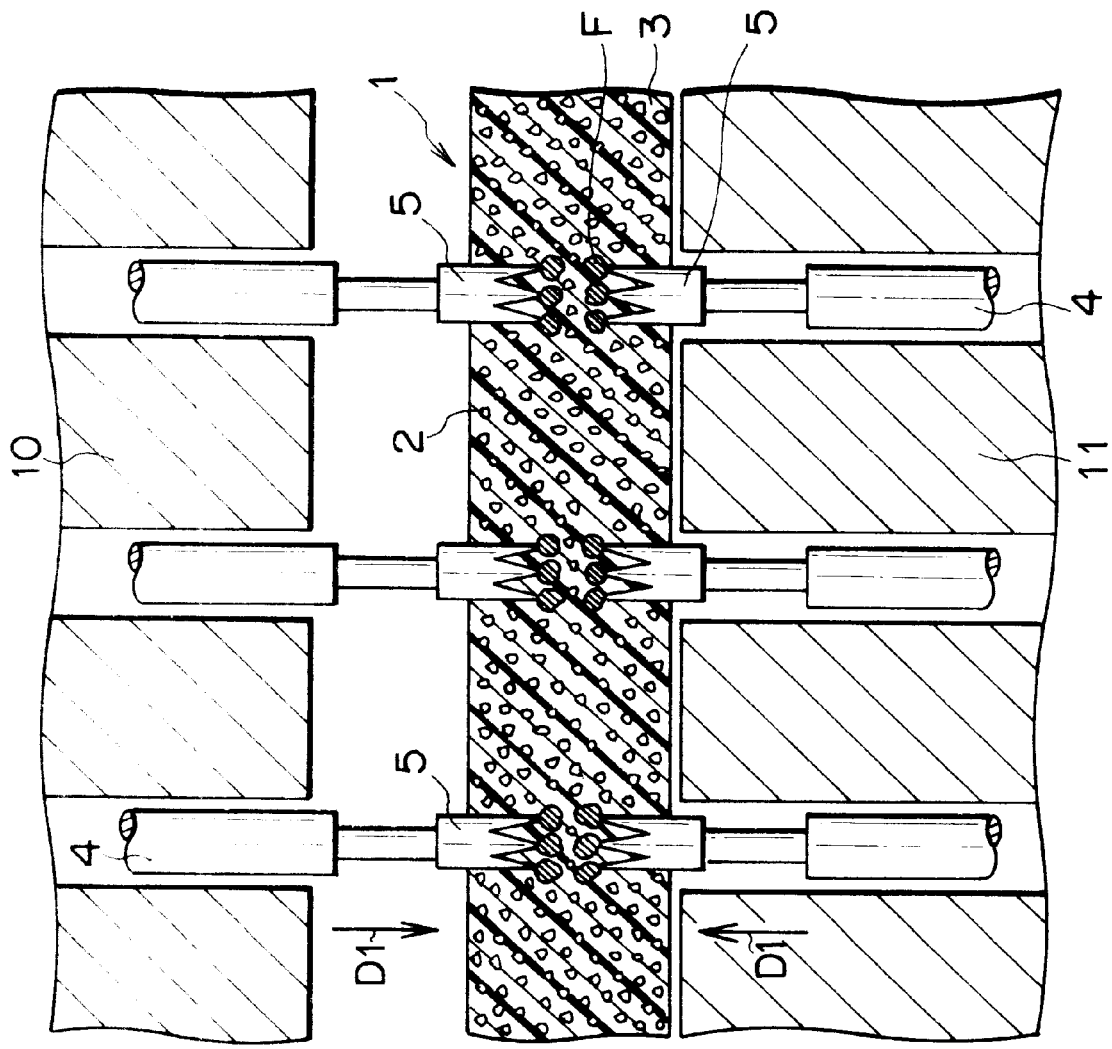
FIG. 5 is a view describing operation for cleaning the extreme ends of the contact pins 5 with the cleaning sheet 1.
Figure 6:
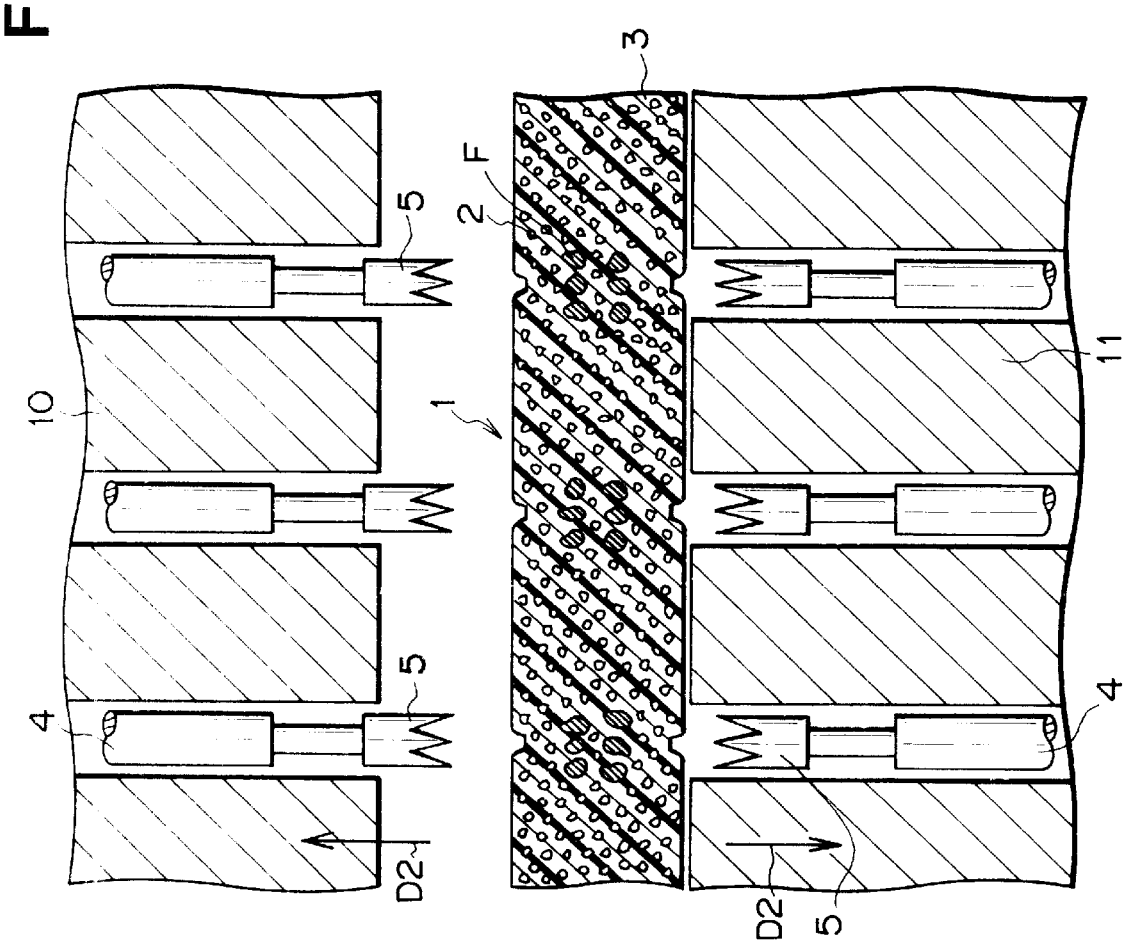
FIG. 6 is a sectional view showing the state after the extreme ends of the contact pins 5 are cleaned with the cleaning sheet 1.

FIG. 4 to FIG. 6 are views describing how the cleaning sheet 1 is set to the incircuit tester described in FIG. 1 in place of the printed circuit board. That is, the flux F deposited at the extreme ends of the contact pins 5 is cleaned by suitably setting the cleaning sheet 1 in place of the printed circuit board. The use of the cleaning sheet 1 eliminates the necessity of the cleaning conventionally effected by the brush. Further, there can be obtained a great advantage that a test process is not affected by the cleaning sheet 1 at all because it can be handled as if it was the printed circuit board 30.

As shown in FIG. 4, the contact pin 5 of the probe 4 is provided with a fork-shaped portion 5b at the extreme end thereof and a stepped portion 5a and the flux F is deposited to the fork-shaped portion 5b as shown in the drawing after the test is carried out 50 times.

Then, the upper plate 10 and the lower plate 11 are moved in the direction of arrows D1 so that the silicone rubber sheet as the cleaning sheet 1 is pierced by the fork-shaped portions 5b from the front and back sides thereof to capture the flux F at the extreme ends of the pins by the metal oxide particles 2 as shown in FIG. 5. Thereafter, the cleaning is finished by moving the upper plate 10 and the lower plate 11 in the direction of arrows D2 as shown in FIG. 6 and the flux F is left in the cleaning sheet 1.

The metal oxide particles 2 are composed of MgO and have a particle size of about 30 microns. Abrasive composed of $Al_2O_3$ or the like or a material similar to it is also effective as the material of the metal oxide particles. When the cleaning sheet 1 is used to a one-side-mounted printed circuit board, the thickness thereof is set to 0.45 mm, whereas when it is used to a both-sides-mounted printed circuit board, the thickness thereof is set to 0.9 mm. However, since the thicknesses are larger than the depth of the fork-shaped portion 5b at the extreme end of the contact pin and smaller than the height from the extreme end of the contact pin to the stepped portion 5a, no problem arises even if the thicknesses thereof are somewhat different from the thickness of the printed circuit board 30 to be tested.

Since the printed circuit board 30 to be tested is arranged as the both-sides-mounted printed circuit board, the contact pins 5 are disposed on the upper and lower surfaces thereof. Thus, the fork-shaped portions 5b at the extreme end of the contact pins are pierced to the cleaning sheet 1 by lowering the contact pins likewise when the electrical test is effected and the flux deposited to the extreme ends thereof can be eliminated by lifting the contact pins thereafter.

After the contact pins pierce the cleaning sheet 1, the holes formed to the cleaning sheet 1 are restored by the elastic force thereof and even if the cleaning sheet 1 is repeatedly used, a similar effect can be obtained until it is chipped off. The material used to the cleaning sheet 1 may be composed of any one or a combination of silicone rubber, styrene rubber, butadiene rubber, ethylene rubber, urethane rubber, butyl rubber, and ethylene propylene rubber.

When the cleaning sheet 1 is chipped off, a similar effect can be obtained again by dislocating the positions of the cleaning sheet 1 where the contact pins are pierced, which permits the repeated use of the cleaning sheet 1 and thus it is excellent in economy.

An experiment carried out to determine the relationship among execution and non-execution of cleaning, frequency of cleaning and erroneous determination ratio shows: when the cleaning was not carried out, an erroneous determination ratio was 23%; when the cleaning was carried out once using the cleaning sheet 1 each time 10 boards were tested, the erroneous determination ratio was 0%; when the cleaning was carried out once using the cleaning sheet 1 each time 20 boards were tested, the erroneous determination ratio was 0%; when the cleaning was carried out once each time 30 boards were tested, the erroneous determination ratio was 0%; when the cleaning was carried out once each time 50 boards were tested, the erroneous determination ratio was 0%; when the cleaning was carried out once using the cleaning sheet 1 each time 60 boards were tested, the erroneous determination ratio was 1%; and when the cleaning was carried out once using the cleaning sheet 1 each time 70 boards were tested, the erroneous determination ratio was 12%.

From the above result, it is found that the erroneous determination in the test process can be prevented when the cleaning is periodically carried out each time 50 boards are tested.

Figure 7:
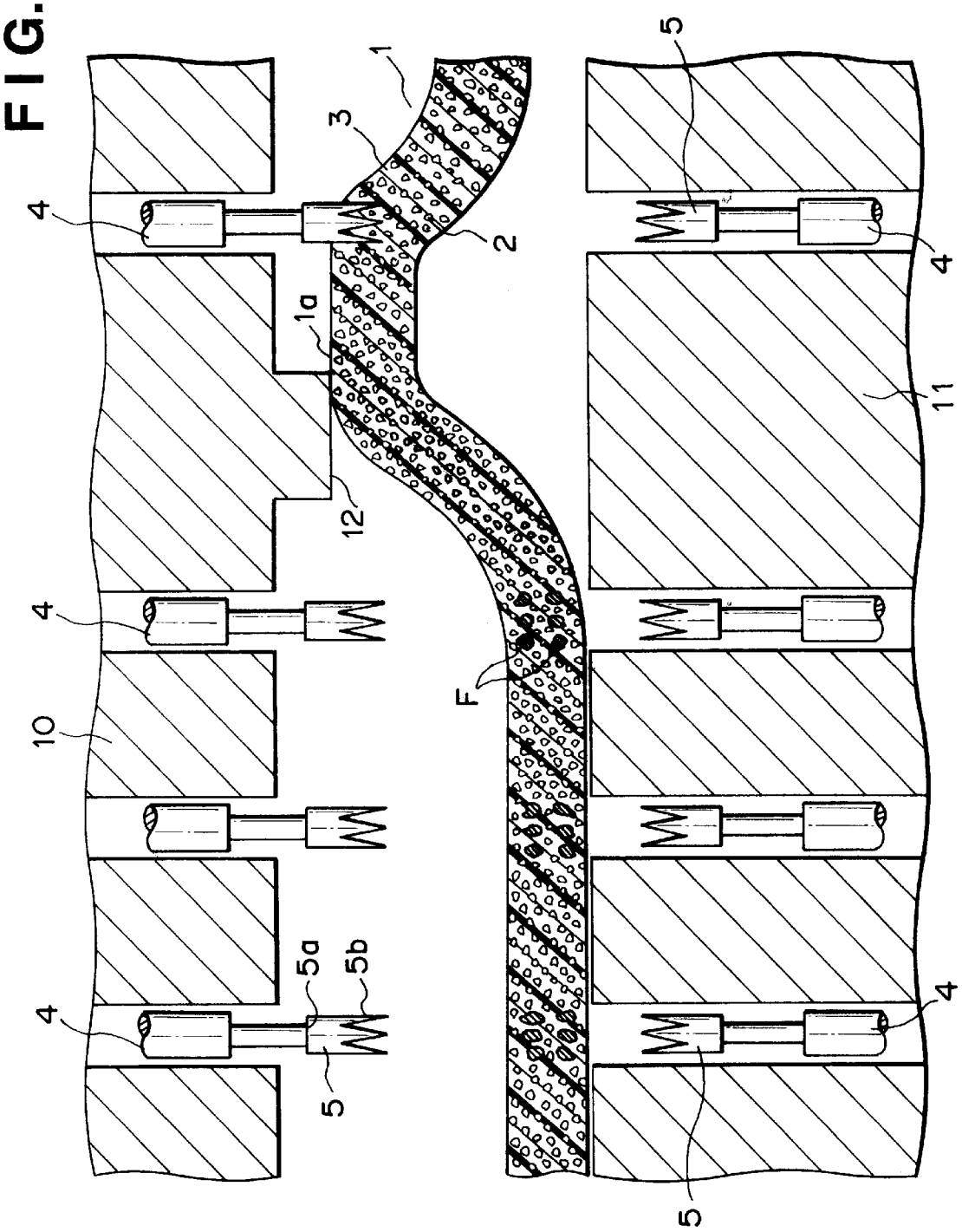
FIG. 7 is a view describing operation of the cleaning sheet 1.

FIG. 7 shows the state that the cleaning sheet 1 is set to the test jig, the extreme ends of the contact pins 5 pierce the cleaning sheet 1 for cleaning and thereafter the contact pins 5 are lifted. In this state, the cleaning sheet 1 is in sticky contact with the board presser portion 12 of the upper plate 10 to which the upper side probes are disposed.

Although it is possible to lower the erroneous determination ratio of the electrical test by the cleaning of the contact pins in the drawing, the handling of the cleaning sheet 1 is troublesome when it is sticky in addition to that it has a thin thickness of about 0.45–0.9 mm.

More specifically, since the surface 1a of the cleaning sheet 1 comes into sticky contact with the presser portion 12 of the printed circuit board mounted to the upper plate 10 to which the contact pins are disposed on the completion of the cleaning, a job for exfoliating the sheet is required each time the completion of the cleaning.

The handing of the cleaning sheet 1 can eased by composing it of a base sheet serving as a base member with a certain degree of hardness and having the silicone rubber sheet as the cleaning sheet 1 bonded to one or both of the front and back surfaces thereof.

Figure 8:
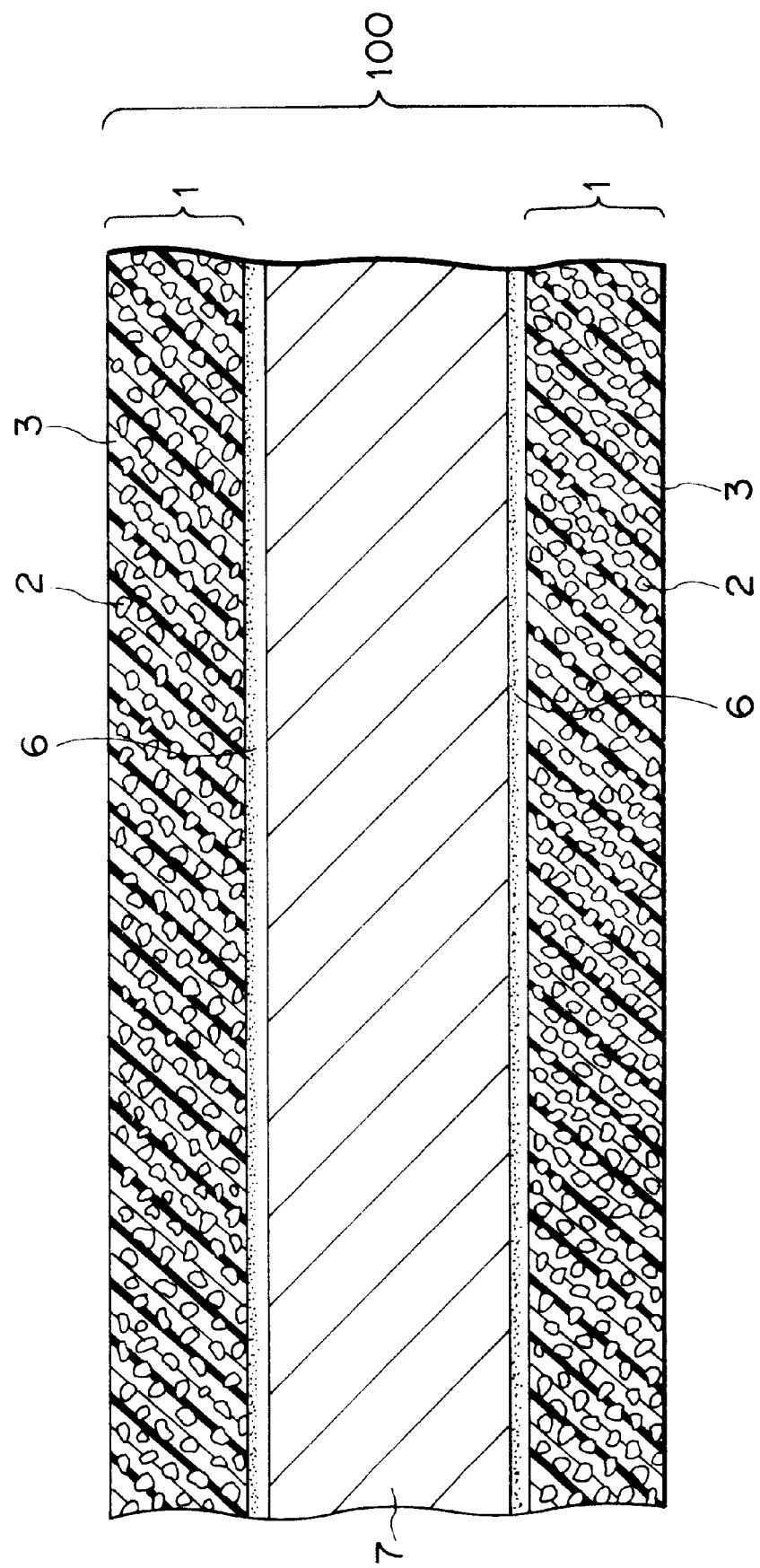
FIG. 8 is a sectional view of a both-sides cleaning sheet 100.

FIG. 8 is a sectional view showing a both-sides cleaning sheet 100 in which the cleaning sheets 1 are bonded to both the surfaces of the base sheet 7 serving as a base member and the flux deposited to the extreme ends of the contact pins 5 is captured by both the surfaces of the cleaning sheet 100.

The both-sides cleaning sheet 100 has a hardness of about 60° and arranged such that the above sheets 1 having the thickness of 0.45 mm is bonded to both the surfaces of the base sheet 7 composed of a plastic sheet or the like having a thickness of 1.2 mm through adhesive 6 serving as bonding layers having electric conductivity.

Figure 9:
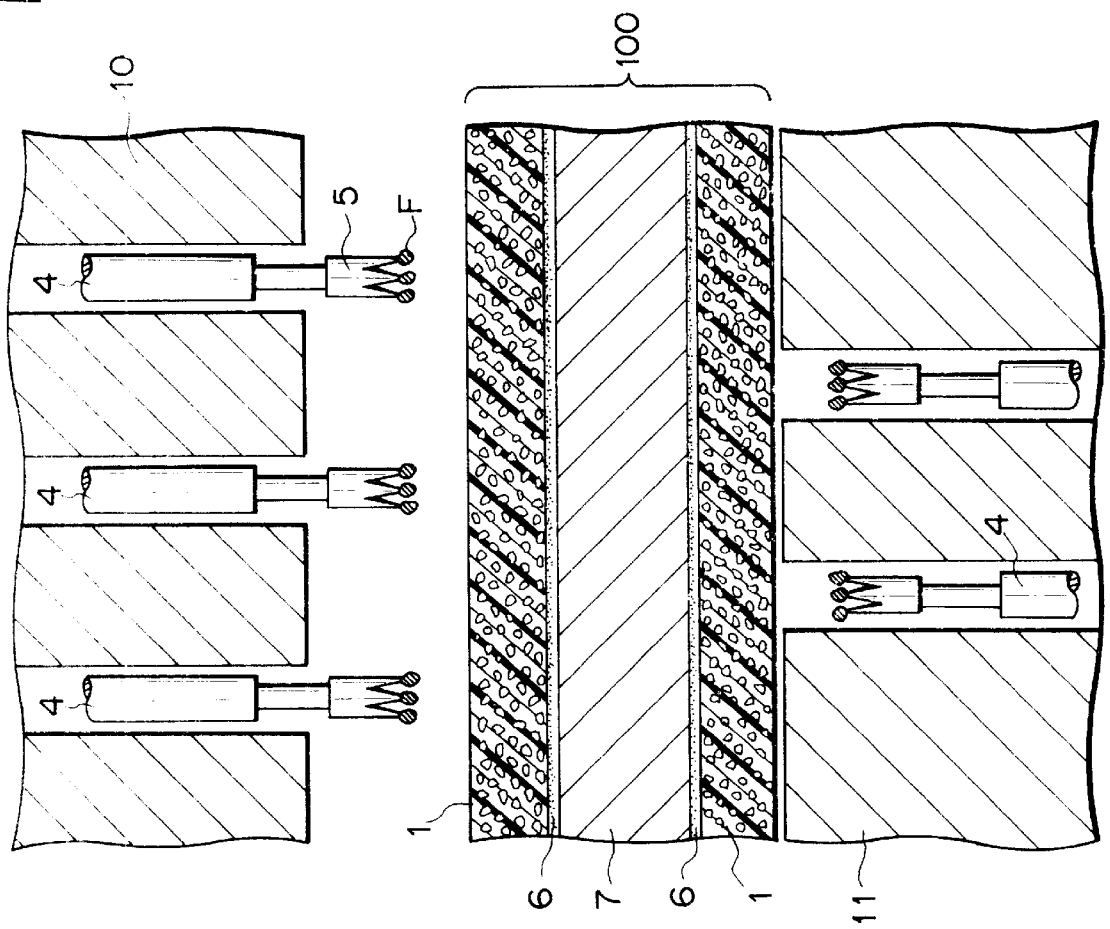
FIG. 9 is a view describing the state before the extreme ends of the contact pins 5 are cleaned with the both-sides cleaning sheet 100.
Figure 10:
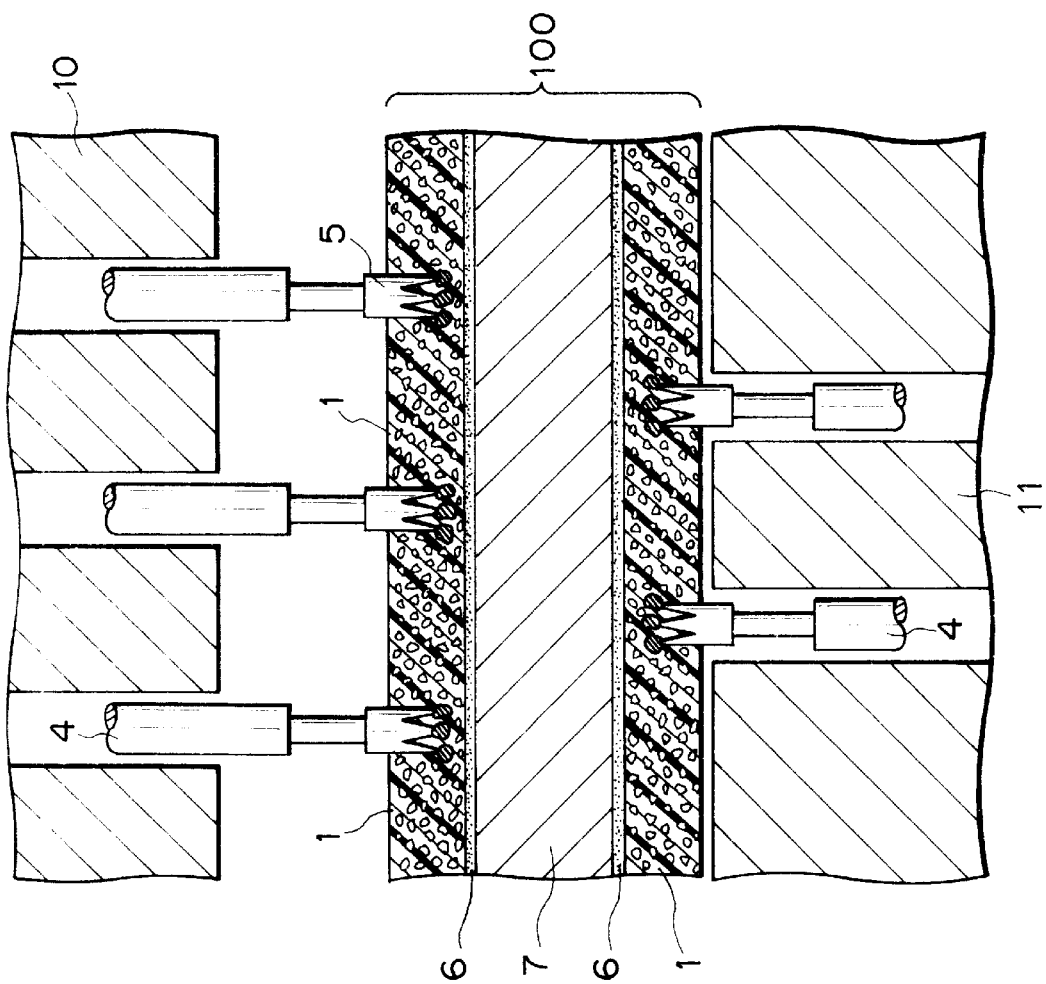
FIG. 10 is a view describing the state the extreme ends of the contact pins 5 are being cleaned with both-sides cleaning sheet 100.
Figure 11:
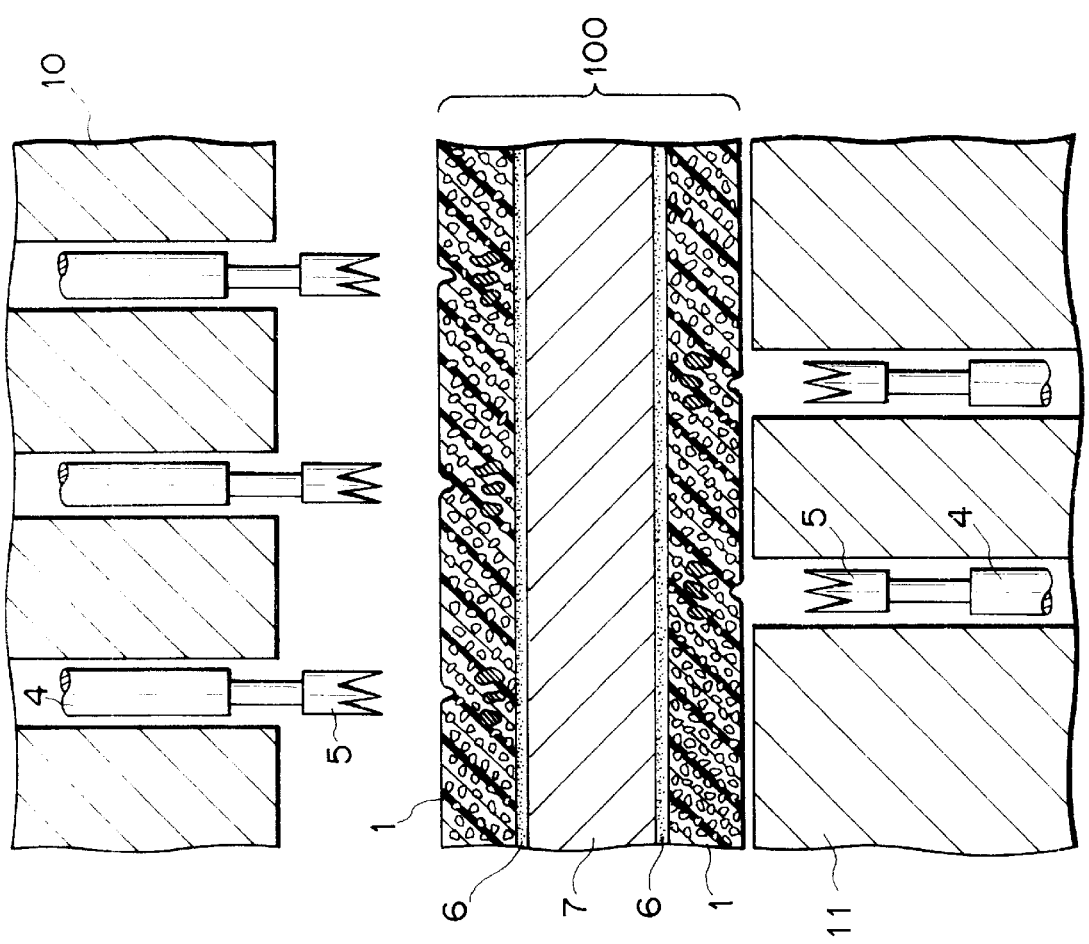
FIG. 11 is a view describing the state that the extreme ends of the contact pins 5 have been cleaned with the both-sides cleaning sheet 100.

The extreme ends of the contact pins are cleaned by setting the both-sides cleaning sheet 100 arranged as described above to the tester and piercing the extreme ends of the contact pins 5 to the both-sides cleaning sheet 100 as shown in FIG. 9 to FIG. 11. Note, MgO having a particle size of about 30 microns is used as the metal oxide particles, silicone rubber having a hardness of 35° is used and the base sheet 7 as the base member is composed of a plastic sheet having a thickness set to 1.2 mm and a hardness of 70°–80°. The base sheet 7 may be composed of a glass epoxy substrate or a hard rubber substrate having a hardness of at least 40°. Further, when the cleaning sheet 1 is liable to be charged with static electricity because it is composed of an insulation material, it is preferable that the base sheet 7 is composed of a conductive material or a base member in which a conductive material such as carbon particles, Ni particles or the like are dispersed to secure a path for causing the static electricity to escape through it.

Although the thickness of the base sheet 7 must be changed depending upon the thickness of the board to be tested, it is not a problem even if the thickness thereof is somewhat different from the thickness of the board to be tested because the silicone rubber sheet 1 has the thickness of 0.45 mm which is larger than the depth of the fork-shaped portions at the extreme ends of the contact pins.

Further, since the board to be tested is the both-side-mounted board, the contact pins 5 are disposed to an upper side and a lower side. As a result, the both-sides cleaning sheet 100 has the cleaning sheets 1, each of which is composed of the silicone rubber sheet, bonded to both the front and back surfaces of base sheet 7 composed of the glass epoxy base member through the adhesive or a pressure sensitive adhesive double coated tape.

In the above arrangement, the flux F at the extreme ends of the contact pins 5 is cleaned by setting the both-sides cleaning sheet 100 in place of the board, lowering the contact pins 5 and piercing the extreme ends of the pins to the cleaning sheet 100 in order to ensure the electric contact state of the tester.

At the time, since the cleaning sheet 1 is bonded to the hard base member, even if it is in sticky contact with the presser side where the printed circuit board is pressed, it is exfoliated therefrom when the pins are lifted. Thus, a job for exfoliating the sticky contact portion is not necessary and the cleaning job can be effectively carried out.

Further, there is also a mechanism which is effective as a method of making the cleaning sheet of the present invention easily usable which is arranged such that a press pin is provided on the side of the board presser member so as to press the cleaning sheet after the completion of cleaning to thereby make it easy to automatically exfoliate the cleaning sheet from the tester so that it can be easily taken out because the cleaning sheet 1 comes into sticky contact with a member by its sticky property which presses the printed circuit board by fixing the upper pins of the probes 4.

When an automatic test process is employed, the availability factor of the test process can be improved by executing the test process in such a manner that the cleaning sheet is disposed for every several boards in a cassette in which the boards to be tested are accommodated and the extreme ends of the contact pins are cleaned without manpower.

As described above, the dirty material such as the flux F and the like deposited to the extreme ends of the plurality of contact pins can be simultaneously cleaned by setting the elastic sheet containing, for example, $Al_2O_3$, MgO or the like as the metal oxide particles 2 in the amount of 40–70 wt %, lowering the contact pins likewise an ordinary test and piercing the contact pins to the elastic members.

Accordingly, a job efficiency can be improved because the unreliable cleaning job which is conventionally carried out by manpower with the brush or the like is made unnecessary and the cleaning job can be securely executed.

As a result, although cleaning is conventionally effected for the first time when contact failure arises because it consumes a time, since it can be periodically carried out, the erroneous determination of the electrical test process is reduced and such erroneous determination as conventionally lowers a test efficiency can be eliminated, whereby a cost can be reduced by the improvement of the yield or decrease of the error rate of the process.

The extreme ends of the plurality of contact pins can be simultaneously cleaned by bonding the board cleaning sheet to both or one of the surfaces of the glass epoxy substrate, the plastic sheet having a proper thickness or the rubber sheet having a proper hardness in accordance with the thickness of the board on which electric parts are mounted and the positioning of the contact pins of the tester (any one of the upper side and the lower side thereof), setting the thus arranged cleaning sheet and piercing the contact pins to the cleaning sheet by lowering the contact pins likewise the ordinary test. Accordingly, the job efficiency is further improved by suppressing the sticky contact of the cleaning sheet to the printed circuit board in the tester as compared with a job effected using only a cleaning sheet and the cleaning of the contact pins which conventionally requires a long time can be more easily carried out.

Further, when the automatic test process is employed, the cleaning sheet of the test process can be improved by executing the test process in such a manner that the cleaning sheet 100 is disposed for every several boards in a cassette in which the boards to be tested are accommodated and the extreme ends of the contact pins are cleaned without manpower.

As described above, according to the present invention, there can be provided the method of cleaning the board electrical-test probes and the cleaning tool capable of securely cleaning the dirty material by a cleaning job effected once which is deposited to the extreme ends of the contact pins of the board electrical-test probes used to the board test device for effecting tests including an incircuit test and in particular, the method and the tool are effective to make the cleaning of the flux unnecessary.

As a result, since cleaning can be periodically carried out although it is conventionally effected for the first time when contact failure arises because it consumes a time, erroneous determination in the electrical test method is reduced and such erroneous determination as conventionally lowers a test efficiency can be eliminated, whereby a cost can be reduced by the improvement of the yield or decrease of the error rate of the process.

Figure 12:
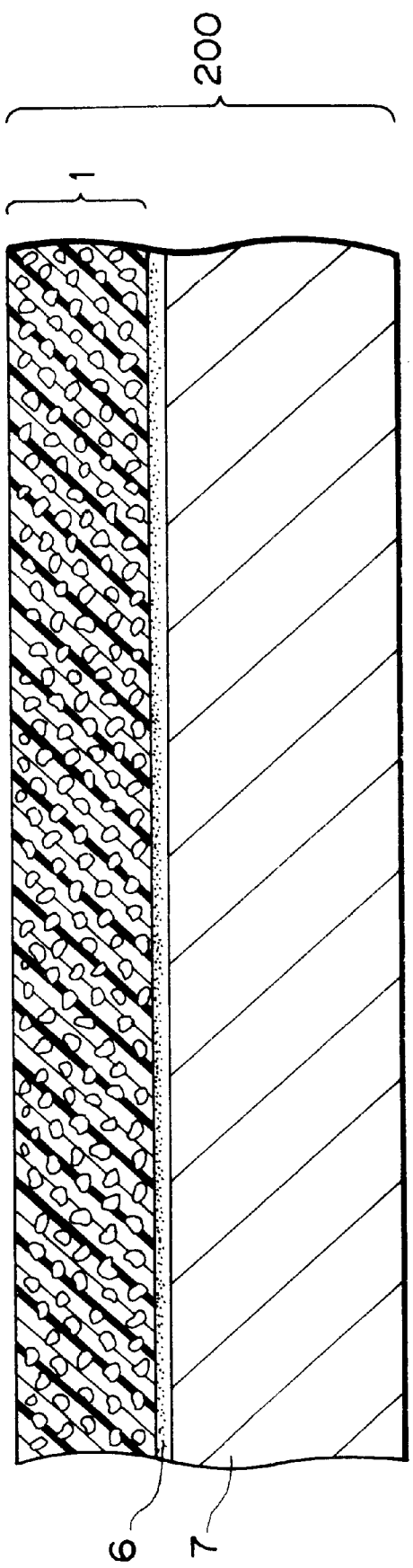
FIG. 12 is a sectional view of a one-side cleaning sheet 200.

The extreme ends of the plurality of contact pins can be cleaned by preparing a both-sides cleaning sheet 100 or a one-side cleaning sheet 200 arranged such that the cleaning sheet 1 is bonded to each of upper and lower surfaces or any one of the upper and lower surfaces as shown in FIG. 12 of the glass epoxy substrate, the plastic sheet having a proper thickness or the rubber sheet 7 having a proper hardness in accordance with the thickness of the board on which electric parts are mounted and the positioning of the contact pins of the tester, setting the thus arranged cleaning sheet to the tester, causing the cleaning sheet to come into contact with the contact pins likewise the ordinary test and piercing the contact pins to the cleaning sheet.

At the time, the job efficiency is more improved because the sticky contact of the test device with the printed circuit board 30 is suppressed as compared with the job using only the cleaning sheet 1 and the cleaning of the contact pins which conventionally requires a long time can be more easily carried out.

Figure 13:
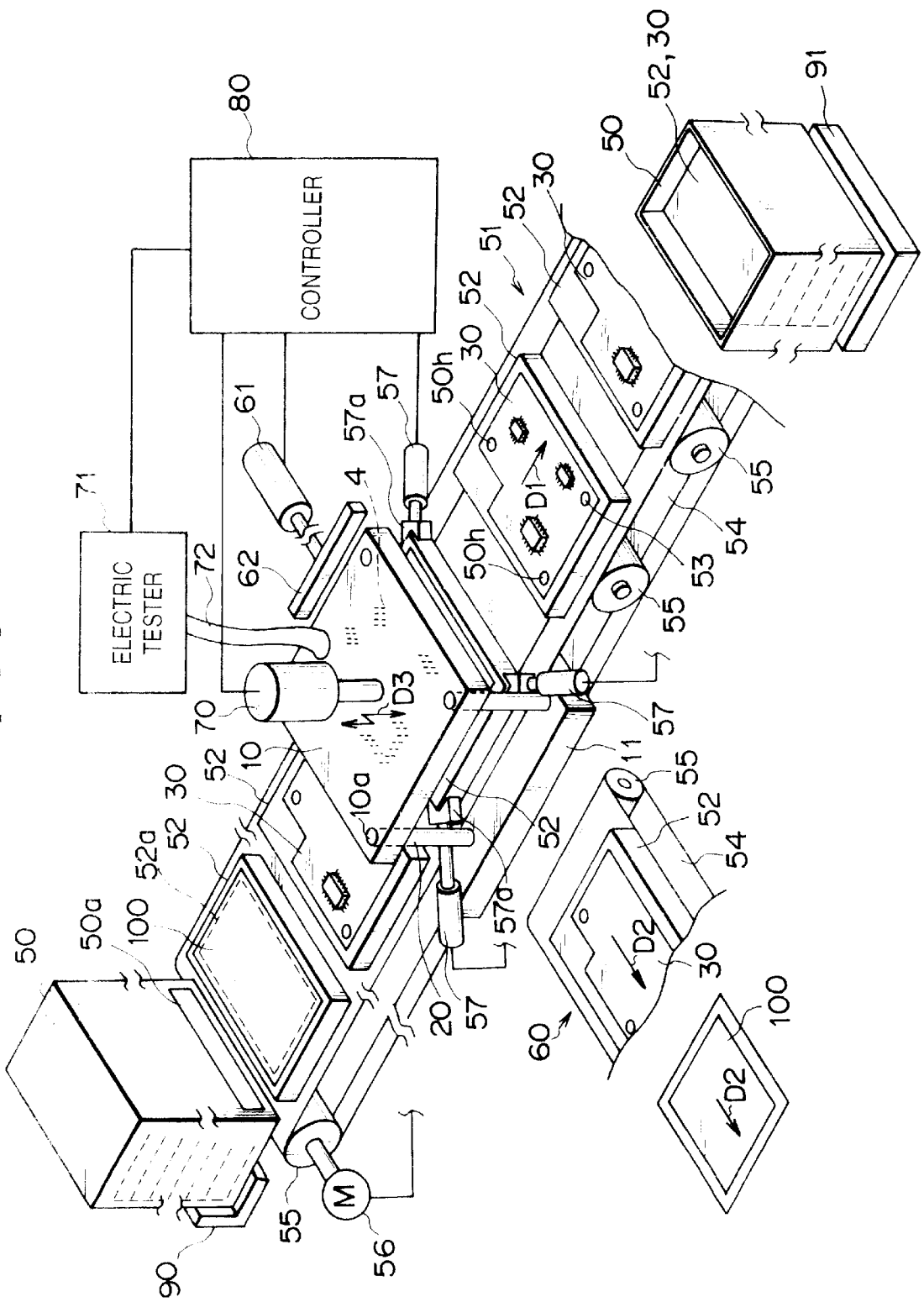
FIG. 13 is an outward appearance perspective view of an automatic board test process in an automated board line.
Figure 15:
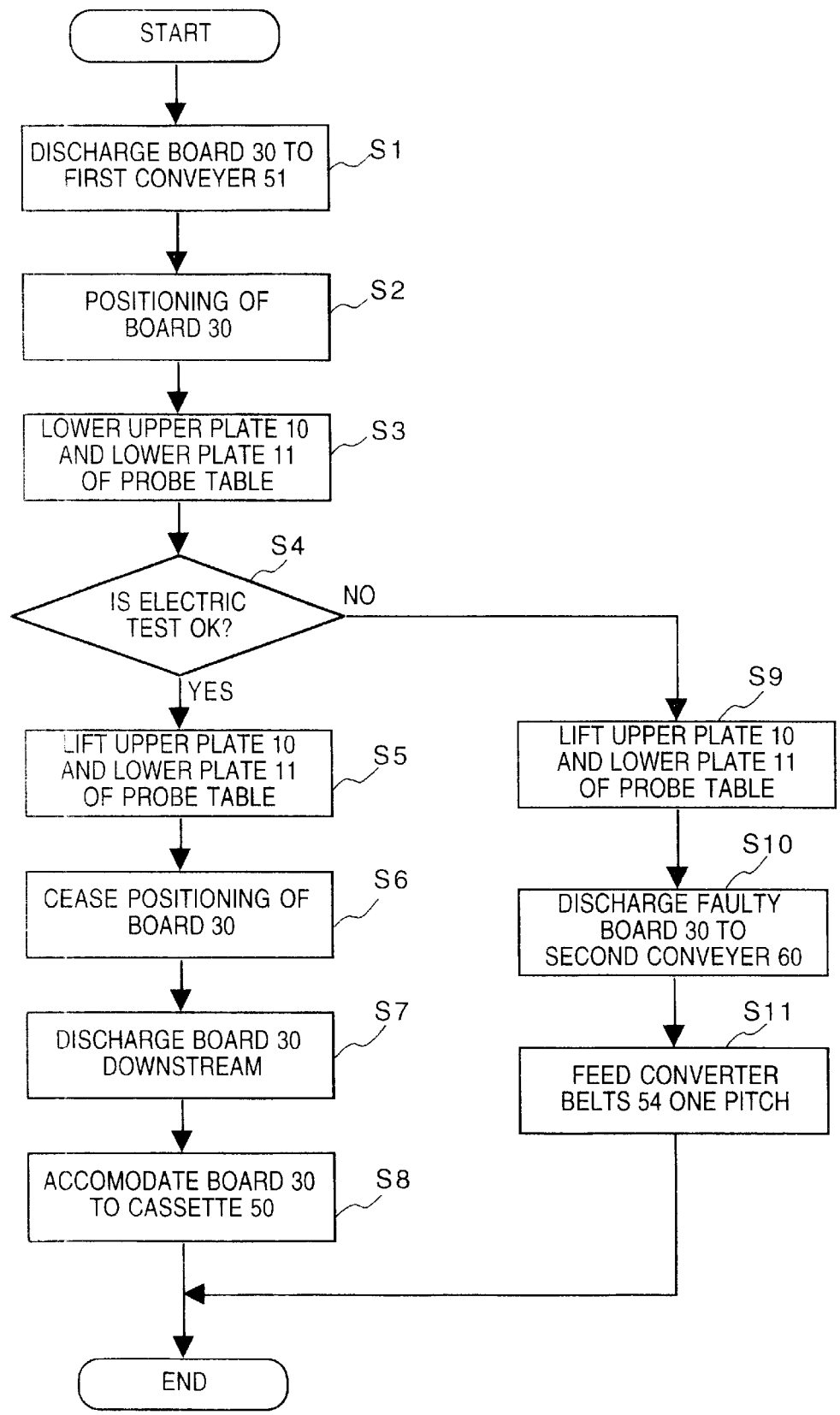
FIG. 15 is a flowchart describing operation of FIGS. 13 and 14.

FIG. 13 is an outward appearance perspective view of an automatic line in which the incircuit test of the board is automatically carried out. In the drawing, the components already described above are denoted by the same numerals and the description thereof is omitted.

First, a plurality of printed circuit board 30 are placed and accommodated in a feed cassette 50 located upstream with the surfaces thereof where parts are mounted facing upward. The printed circuit board 30 has positioning holes 30h formed to at least two positions, and since the holes 30h are formed so as to provide a correct relative distance to a print pattern for surface mounted parts, the relative position of the board 30 to the four corners of a holder 52 can be determined by inserting the holes 30h to positioning pins 53 disposed on the holder 52.

The boards 30 prepared by being secured to the holders 52 are prepared by being piled in the feed cassette 50 Further, a holder 52 on which the both-sides cleaning sheet 100 is disposed so as to cover the opening 52a (shown by the broken line in the drawing) of the holder 52 is prepared for, for example, every 50 holders 52 in the feed cassette 50. To describe in more detail, the holder 52 on which the cleaning sheet is disposed is prepared next to the 50th holder 52 on which the printed circuit board 30 is secured.

The feed cassette 50 is set on a cassette feed unit 90 as well as successively feeds the holders 52 one by one from the opening 50a thereof onto a first conveyer 51 as conveyer means. As shown in the drawing, the first conveyer 51 is meshed with a multiplicity of conveyer rollers 55 so as to move in the direction of an arrow D1 in the drawing and comprises two conveyer chains 54 spaced apart from each other across an opening corresponding to the area of the board 30 and a jig provided with the board electrical-test probes of a test jig is disposed midway of the conveyer. A driving sprocket 55 located at the most upstream position of the line is intermittently driven by a drive motor 56 composed of a stepping motor.

An upper plate 10 and a lower plate 11 each having a multiplicity of the board electrical-test probes 4 disposed thereon are provided so as to move upwardly and downwardly in the direction of an arrow D3 shown in the drawing along four guide shafts 20 vertically standing from a not shown base portion and moved upwardly and downwardly by an upward/downward moving air cylinder 70, respectively.

In addition, positioning air cylinders 57 which are secured to the base portion is disposed in the vicinity of the guide shafts 20 and actuators 57a move so as to be abutted against the corners of the holder 52 so that the successively fed holders 52 are positioned and secured to the base portion by the actuators 57a.

With the arrangement as described above, the board 30 is positioned relative to the probes 4. Further, a discharge air cylinder 61 is disposed rearward of the upper plate 10 and the lower plate 11 to push out a board 30, when it is determined a faulty board, onto a second conveyer 60 located forward and the air cylinder 61 can also discharge a cleaning sheet as described later.

Since the second conveyer 60 is arranged substantially similar to the first conveyer 51 as shown in the drawing, although only the numerals of the components of the second conveyer 60 are shown and the description thereof is omitted, the conveyer 60 conveys the faulty board and the cleaning sheets 100 and 200 in the direction of arrows D2.

As shown in the drawing, a cassette accommodation unit 91 is disposed to the downmost-stream side of the first conveyer 51 so that the cassette 50 is detachably placed thereon. The boards having passed the test are accommodated in the cassette 50 together with the holders 52 in a piled state so that they are conveyed to the next function test (steps S5, S6 of FIG. 19) process in the unit of the cassette.

FIG. 14 is a block diagram showing the arrangement of the apparatus shown in FIG. 13, wherein the cassette feed unit 90, the first conveyer 51, the jig composed of the upper and lower plates 10, 11 each having the probes 4 disposed thereon, the second conveyer 60 and the cassette accommodation unit 91 are connected to an automatic test line controller 80, respectively, whereas a tester 71 including cables 72 individually connected to the probes 4 is connected as shown in the drawing.

Figure 19:
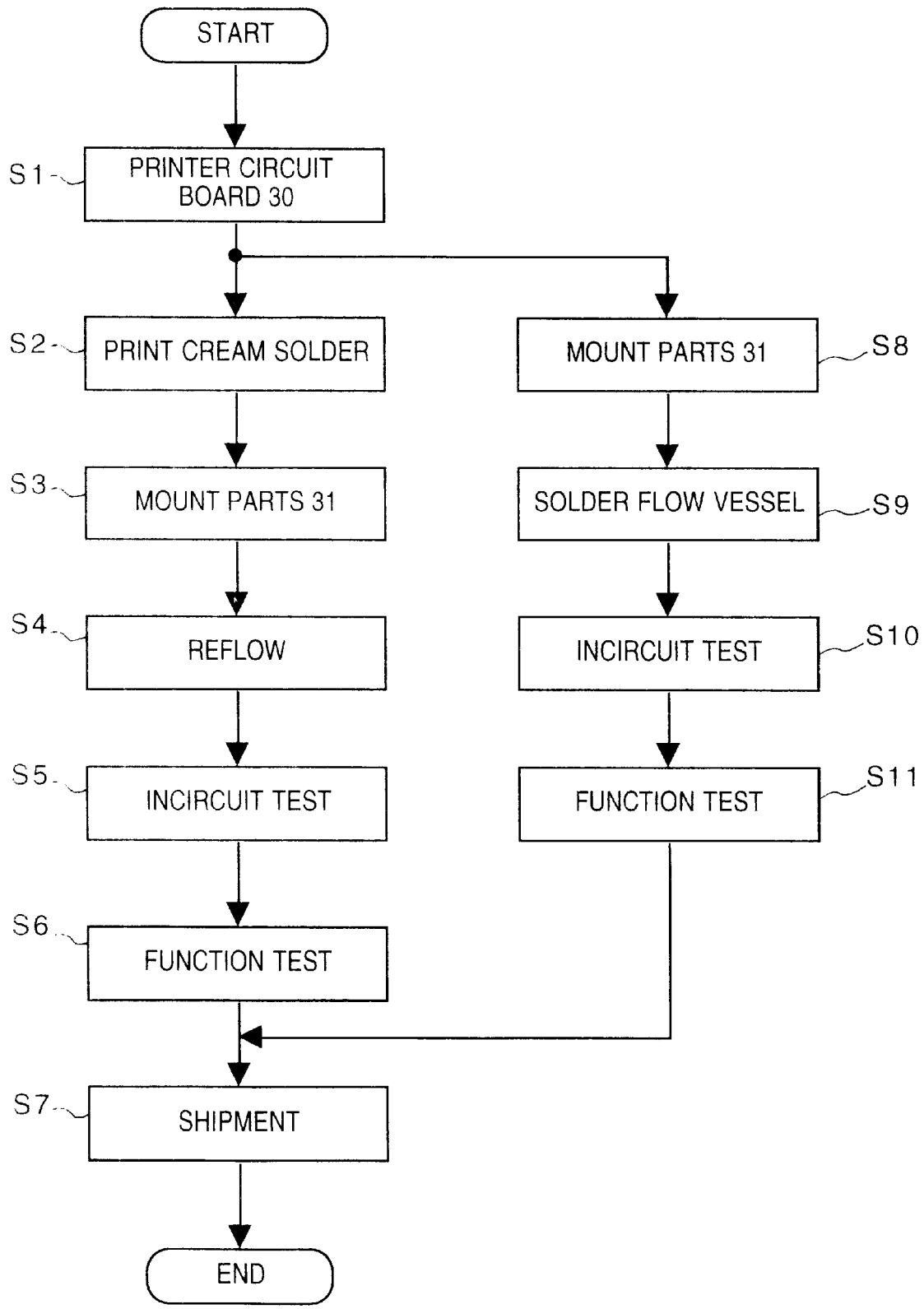
FIG. 19 is a flowchart for mounting parts on a printed circuit board.
Figure 20:
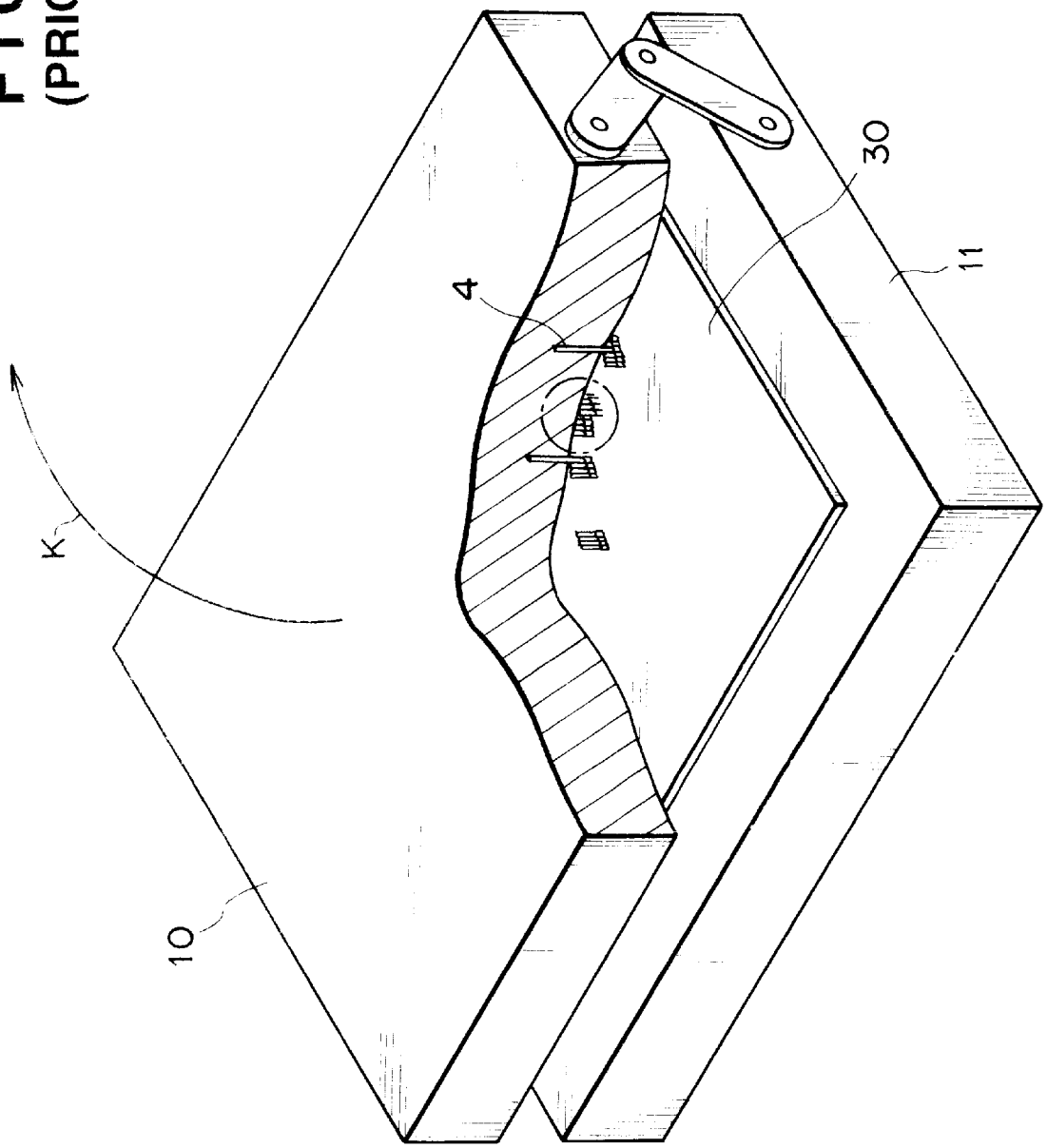
FIG. 20 is an outward appearance perspective view of a prior art board test jig.
Figure 21:
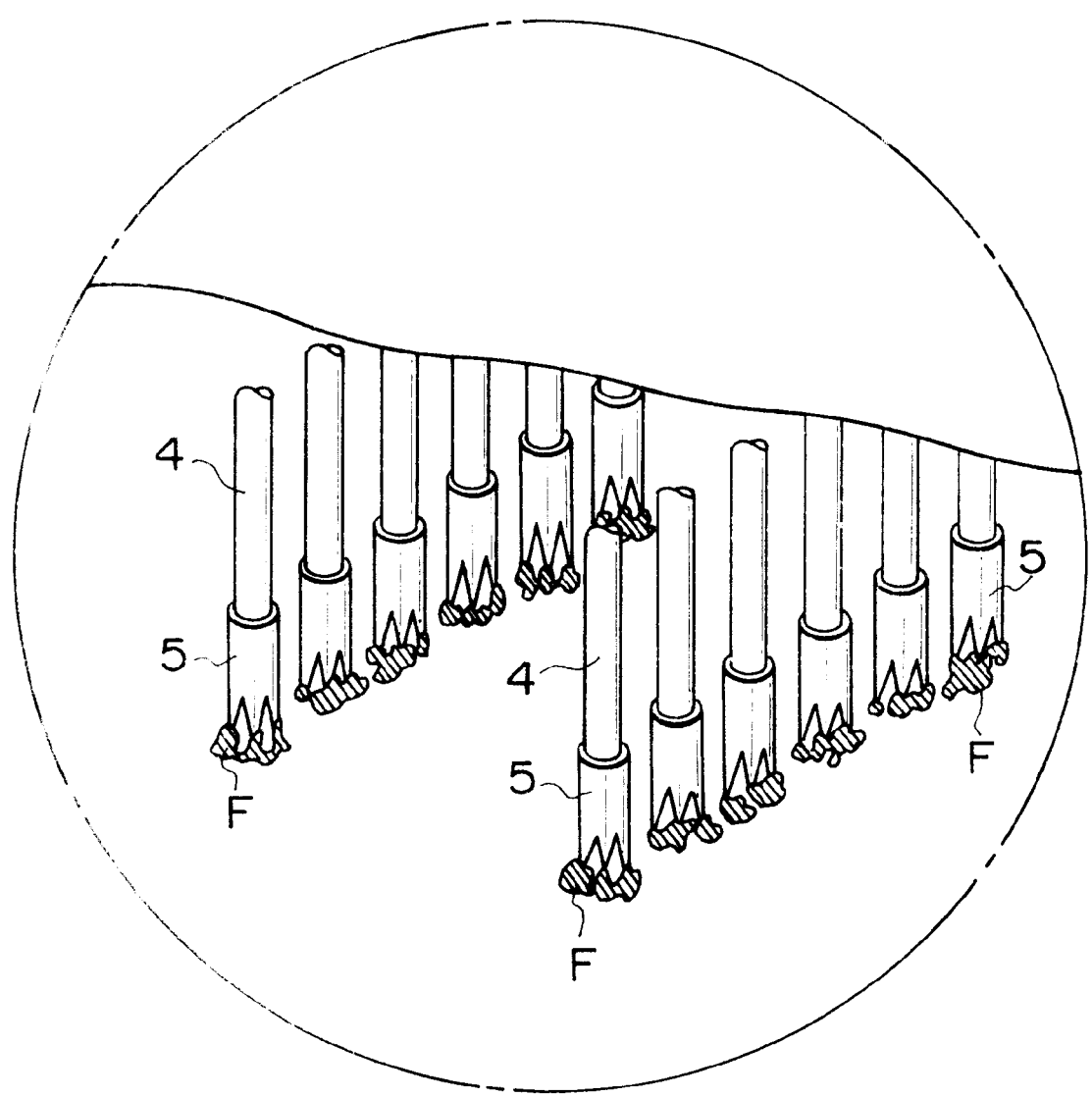
FIG. 21 is an enlarged outward appearance perspective view of the main portion of FIG. 20.

When the automatic line is started in the above arrangement, the feed unit 90 is started at step S1 of FIG. 19, one of the holders 52 each having the board 30 secured thereto is conveyed onto the first conveyer 51 and conveyed downstream (in the direction of an arrow D1) by the drive motor 56 and stopped at a test position which is located between the upper plate 10 and the lower plate 11. Thereafter, all the four positioning air cylinders 57 are driven at step S2 to thereby position the holder 52 by regulating the four corners thereof.

Subsequently, the upward/downward drive air cylinder 70 is driven at step S3 to cause the sharp extreme ends of the contact pins 5 of the respective probes 4 to break the flux F remaining on the solder fillets 33 at the extreme ends of the QFP leads of an IC package because it is not cleaned and securely come into contact with the solder fillets 33 as shown in FIG. 2.

Thereafter, the incircuit test (steps S5, S10 of FIG. 19) is carried out at step S4. When no abnormality is detected as a result of the test, the process goes to step S5 where the air cylinder 70 is driven in a reverse direction to thereby separate the upper plate 10 and the lower plate 11 from the board 30. Next, the air cylinders 57 is driven in a reverse direction to cease the positioning and the operation of the first conveyer 51 is resumed to convey the board 30 having been tested to the cassette 50 on the downstream side.

When the holder 52 having the board 30 placed thereon is dropped into the cassette 50, the lift mechanism of the cassette accommodating unit 91 is lowered to keep the holder 52 on the same level at all times (step S8).

Whereas, when it is determined at step S4 that abnormality arises as the result of the test, the air cylinder 70 is driven in the reverse direction to thereby separate the upper plate 10 and the lower plate 11 from the board 30 and subsequently the end surface of the holder 52 is pushed and moved by a pusher 62 by driving the air cylinder 61 at step S10 so that it is pushed onto the second conveyer 60 and discharged together with the faulty board 30.

Thereafter, the second conveyer 60 is moved by the distance of one holder 52 and the faulty board detecting operation is finished. When the faulty board is detected as described above, it can be eliminated by the provision of the faulty board discharge process for discharging it forward from the conveyer path of the first conveyer 51.

The flux F deposited to the extreme ends of the contact pins 5 can be securely cleaned with the both-sides cleaning sheet 100 which is previously placed on the holder 52. That is, since the contact pins 5 are pierced to the elastic sheet molded with the fine metal oxide particles dispersed therein in the specific weight percent, the dirty material containing the solder flux deposited to the extreme ends of the pins is securely captured in the elastic sheet when the upper plate 10 is moved downward by driving the air cylinder 70 and thereafter the air cylinder 70 is driven reversely to pull out the extreme ends of the contact pins from the elastic sheet.

Therefore, the movement of the extreme ends of the contact pins can be used for cleaning as it is.

Since the base sheet 7 and the adhesive layer 6 have electric conductivity, their conductivity is detected by all the probes. Thus, since they are determined short-circuited and discharged onto the second conveyer 60 as faulty parts, they can be reused by being set to the cassette 50 again.

Accordingly, only the provision of the cleaning sheets 100, 200 in the cassette for every several sets of the boards to be tested permits the execution of cleaning in the automatic test process in the full-automatic line. This means that the extreme ends of the contact pins can be cleaned without the need of special remodeling of the full-automatic line for the cleaning of the contact pins which is indispensable in the automatic line in which flux is not cleaned.

As described above, the present invention can provide the board electrical-test method, the board electrical-test device and the cleaning tool used in the electrical board test, which permits the dirty material deposited to the extreme ends of the contact pins of the board electrical-test probes used in the board test device for executing tests including the incircuit test to be securely cleaned by a cleaning job effected once. In addition to the above, there is provided an advantage that the operation of a board manufacturing line in which the flux is not cleaned can be easily automated.

As described above, the dirty material such as the flux F and the like deposited to the extreme ends of the plurality of contact pins can be simultaneously cleaned by setting the elastic sheet containing, for example, $Al_2O_3$, MgO or the like as the metal oxide particles 2 in the amount of 40–70 wt %, lowering the contact pins likewise an ordinary test and piercing the contact pins to the elastic members. Accordingly, a job efficiency can be improved because the unreliable cleaning job which is conventionally carried out by manpower with the brush or the like is made unnecessary and the cleaning job can be securely executed.

As a result, although cleaning is conventionally effected for the first time when contact failure arises because it consumes time, since it can be periodically carried out, the erroneous determination of the electrical test process is reduced and such erroneous determination as conventionally lowers a test efficiency can be eliminated, whereby a cost can be reduced by the improvement of the yield or decrease of the error rate of the process.

The extreme ends of the plurality of contact pins can be cleaned by preparing both-sides cleaning sheet 100 or a one-side cleaning sheet 200 arranged such that the cleaning sheet 1 is bonded to each of upper and lower surfaces or any one of the upper and lower surfaces as shown in FIG. 12 of the glass epoxy substrate, the plastic sheet having a proper thickness or the rubber sheet 7 having a proper hardness in accordance with the thickness of the board on which electric parts are mounted and the positioning of the contact pins of the tester, setting the thus arranged cleaning sheet to the tester, causing the cleaning sheet to come into contact with the contact pins likewise the ordinary test and piercing the contact pins to the cleaning sheet.

At the time, the job efficiency is more improved because the sticky contact of the test device with the printed circuit board 30 is suppressed as compared with the job using only the cleaning sheet 1 and the cleaning of the contact pins which conventionally requires a long time can be more easily carried out.

Figure 16:
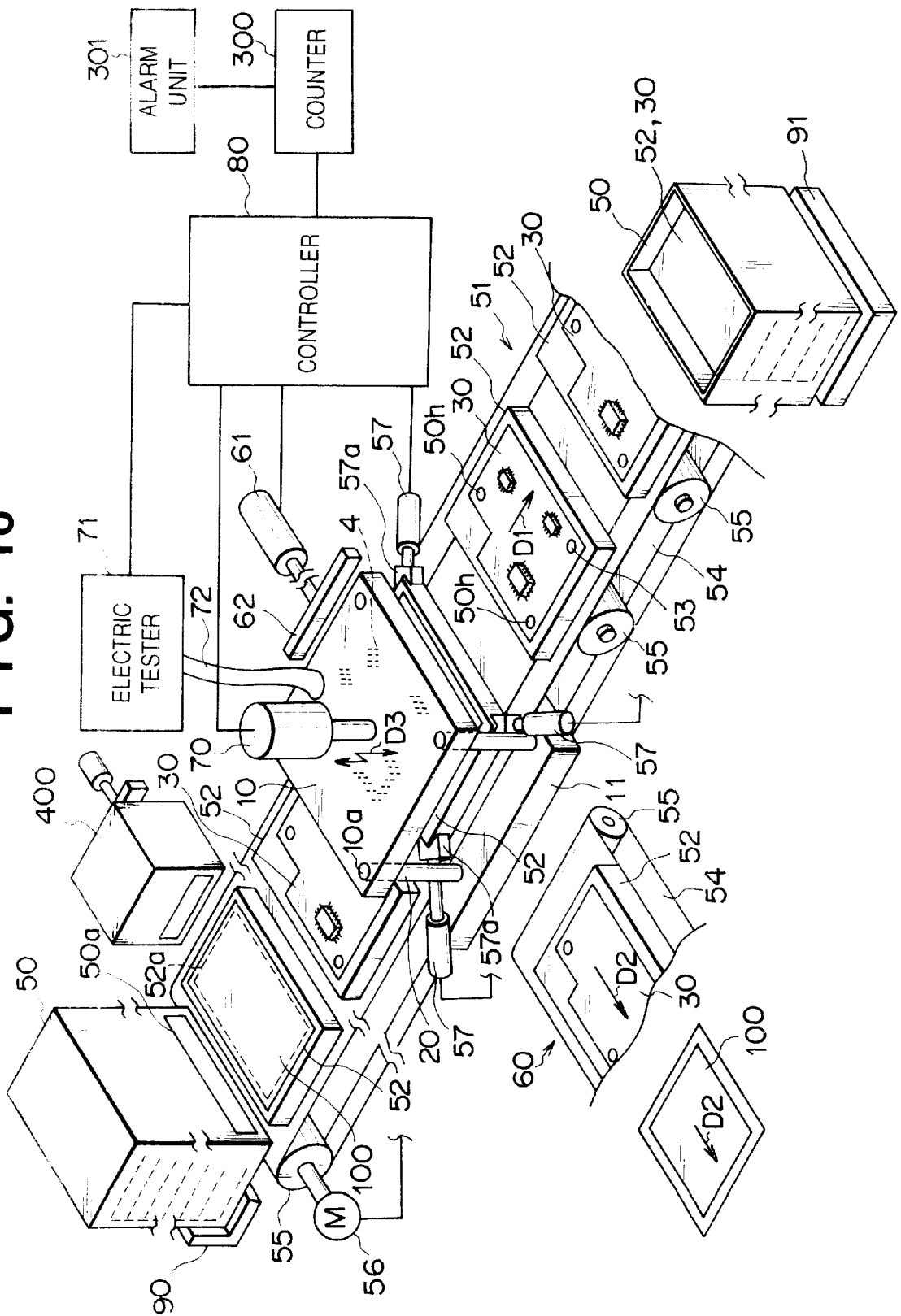
FIG. 16 is an outward appearance perspective view of an automatic board tester in an automated board line.
Figure 17:
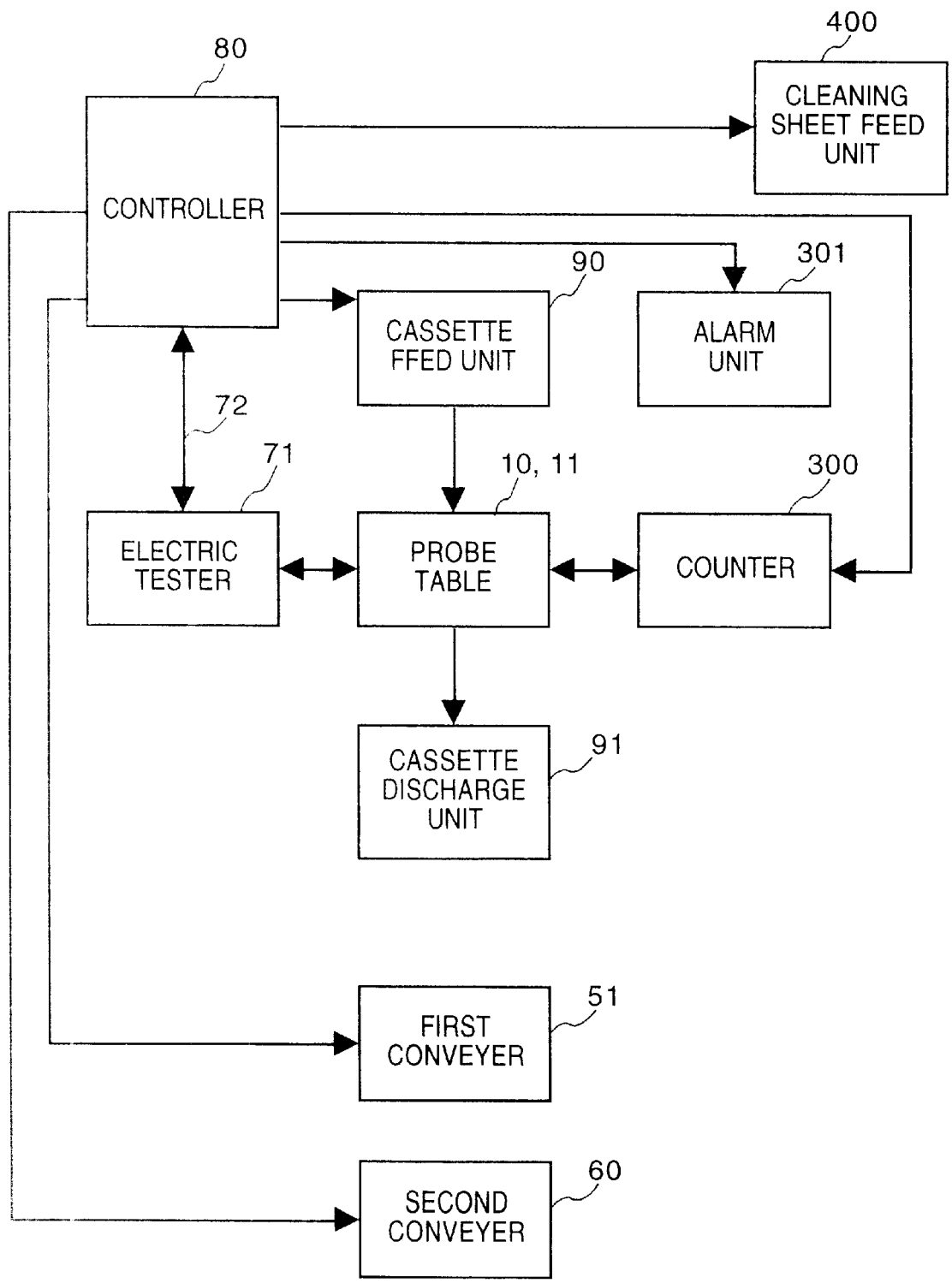
FIG. 17 is a block diagram of FIG. 16.
Figure 18:
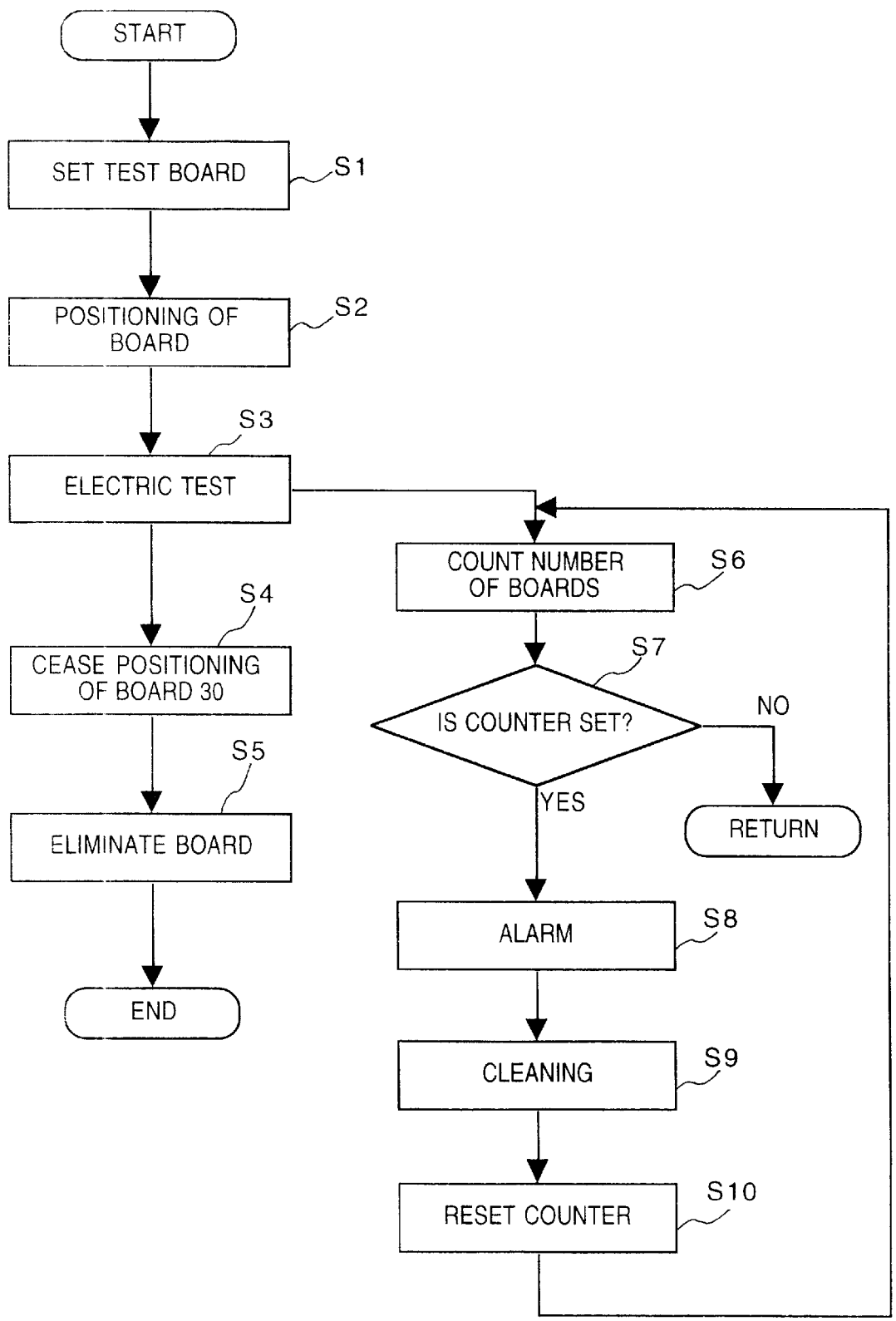
FIG. 18 is a flowchart describing operation of FIGS. 16 and 17.

FIG. 16 is an outward appearance perspective view of an automatic line in which the incircuit test of the board is automatically carried out. In the drawing, the components already described above are denoted by the same numerals and the description thereof is omitted.

First, a plurality of printed circuit board 30 are placed and accommodated in a feed cassette 50 located upstream with the surfaces thereof where parts are mounted facing upward. The printed circuit board 30 has positioning holes 30h formed to at least two positions, and since the holes 30h are formed so as to provide a correct relative distance to a print pattern for surface mounted parts, the relative position of the board 30 to the four corners of a holder 52 can be determined by inserting the holes 30h to positioning pins 53 disposed on the holder 52.

The boards 30 prepared by being secured to the holders 52 are prepared by being piled in the feed cassette 50. Further, an elastic sheet conveyer 400 is disposed in the vicinity of the cassette 50 to convey one holder 52 on which the both-sides cleaning sheet 100 is placed so as to close the opening 52a (shown by the broken line in the drawing) of the holder 52 for, for example, every 50 holders 52.

Unless the elastic sheet conveyer 400 is disposed, the holder 52 on which is the both-sides cleaning sheet 100 is placed is disposed next to the 50th holder on which the board 30 is secured as shown in the drawing when an alarm is given from an alarm unit 301 which will be described later. The feed cassette 50 is set on a cassette feed unit 90 as well as successively feeds the holders 52 one by one from an opening 50a thereof onto a first conveyer 51 as conveyer means. As shown in the drawing, the first conveyer 51 is supported by a multiplicity of conveyer rollers 55 as well as disposed between two conveyer chains 54 spaced apart from each other across an opening corresponding to the area of the board 30 and the two conveyer chains 54 are meshed with the sprocket gears of a drive motor so that the first conveyer 51 is moved in the direction of an arrow D. A jig provided with the board electrical-test probes of a test jig is disposed midway of the conveyer. A driving sprocket 55 located at the most upstream position of the line is intermittently driven by the drive motor 56 composed of a stepping motor.

An upper plate 10 and a lower plate 11 each having a multiplicity of the electric board test probes 4 disposed thereon are provided so as to be moved upwardly and downwardly in the direction of an arrow D3 shown in the drawing along four guide shafts 20 vertically standing from a not shown base portion and moved upwardly and downwardly by an upward/downward moving air cylinder 70.

In addition, positioning air cylinders 57 which are secured to the base portion is disposed in the vicinity of the guide shafts 20 and actuators 57a move so as to be abutted against the corners of the holder 52 so that the successively fed holders 52 are positioned and secured to the base portion by the actuators 57a.

With the arrangement as described above, the board 30 is positioned relative to the probes 4. Further, a discharge air cylinder 61 is disposed rearward of the upper plate 10 and the lower plate 11 to push out a board 30, when it is determined a faulty board, to a second conveyer 60 located forwardly and it can also discharge a cleaning sheet as described later.

Since the second conveyer 60 is arranged substantially similar to the first conveyer 51 as shown in the drawing, although only the numerals of the components of the second conveyer 60 are shown and the description thereof is omitted, the conveyer 60 conveys the faulty board and the both-sides cleaning sheets 100 and the one-side cleaning sheets 200 in the direction of arrows D2.

As shown in the drawing, a cassette accommodation unit 91 is disposed to the downmost-stream side of the first conveyer 51 so that the cassette 50 is detachably placed thereon. The boards having passed the test are accommodated in the cassette accommodation unit 91 together with the holders 52 in a piled state so that they are conveyed to the next function test (steps S5, S6 of FIG. 16) process in the unit of the cassette.

FIG. 14 is a block diagram showing the arrangement of the apparatus shown in FIG. 13, wherein the cassette feed unit 90, the first conveyer 51, the jig composed of the upper and lower plates 10, 11 each having the probes 4 disposed thereon, the second conveyer 60 and the cassette accommodation unit 91 are connected to an automatic test line controller 80, respectively, whereas a tester 71 including cables 72 individually connected to the probes 4 is connected as shown in the drawing.

Further connected to the automatic test line controller 80 are the elastic sheet conveyer 400 and the alarm unit 301 which are described above and a counter 300 for counting the number of movements of the upper and lower sheets to which the probes 4 are disposed.

When the automatic line is started in the above arrangement, the cassette feed unit 90 is started at step S1 of FIG. 19, a first one of the holders 52 each having the board 30 secured thereto is conveyed onto the first conveyer 51. Consequently, it is conveyed downstream (in the direction of an arrow D1) by the drive motor 56 and stopped at the position of the jig which is located between the upper plate 10 and the lower plate 11. Thereafter, all the four positioning air cylinders 57 are driven at step S2 to thereby position the holder 52 by regulating the four corners thereof.

Subsequently, the upward/downward drive air cylinder 70 is driven at step S3 to cause the sharp extreme ends of the contact pins 5 of the respective probes 4 to break the flux F remaining on the solder fillets 33 at the extreme ends of the QFP leads of an IC package because it is not cleaned and securely come into contact with solder fillets 33 as shown in FIG. 2. In addition, the contact pins 5 are also located on the solder fillets 33 of other electronic parts likewise. Thereafter, the incircuit test (steps S5, 10 of FIG. 19) is carried out. When no conductivity failure and the like are detected as a result of the test, the process goes to step S4 where the air cylinder 70 is driven in a reverse direction to separate the upper plate 10 and the lower plate 11 from the board 30. Next, the air cylinders 57 is driven in a reverse direction to cease the positioning and the operation of the first conveyer 51 is resumed to convey the board 30 having been tested to the cassette 50 on the downstream side (step S5).

When the holder 52 having the board 30 placed thereon is dropped into the cassette 50 as described above, the lift mechanism of the cassette accommodating unit 91 is lowered to keep the holder 52 on the same level at all times.

The number of drives of the upper plate 10 and the lower plate 11 is counted by the counter 300 at step S6 and it is determined whether the number is the 50th time which previously input or not at step S7. When the count value coincides with the 50th time at step S7, an alarm is given by starting the alarm unit 301 to thereby prompt the operator to set the cleaning sheet. Otherwise, the cleaning sheet placed on the holder 52 is automatically conveyed onto the conveyer path by starting the elastic sheet conveyer 400.

Thereafter, the contact pins are cleaned by moving the upper plate 10 and the lower plate 11 by the air cylinder 70 at step S9. Then, the counter 300 is reset to zero at step S10.

Subsequently, the end surface of the holder 52 is pushed and moved by a pusher 62 by driving the air cylinder 61 so that the cleaning sheet is discharged by being pushed out onto the second conveyer 60 together with the holder 52.

As described above, the flux F deposited to the extreme ends of the contact pins 5 can be securely cleaned with the both-sides cleaning sheet 100 or the one-side cleaning sheet 200 which is previously placed on the holder 52.

That is, since the contact pins 5 are pierced to the elastic sheet molded with the fine metal oxide particles dispersed therein in the specific weight percent, the dirty material containing the solder flux deposited to the extreme ends of the pins is securely captured in the elastic sheet when the upper plate 10 is moved downward by driving the air cylinder 70 and thereafter the air cylinder 70 is driven reversely to thereby pull out the extreme ends of the contact pins from the elastic sheet. Therefore, the movement of the extreme ends of the contact pins can be used for cleaning as it is. Since the base sheet 7 and the adhesive layer 6 have electric conductivity, their conductivity is detected by all the probes and they are determined short-circuited. Thus, the both-sides cleaning sheet 100 or the one-side cleaning sheet 200 is handled as a faulty part and can be discharged onto the second conveyer 60. Therefore, they can be reused by being set again.

Accordingly, the contact pins can be automatically cleaned with the cleaning sheets 100, 200 in the automatic test process of the full-automatic line. This is very effective because it means that the extreme ends of the contact pins can be cleaned without the need of special remodeling of the full-automatic line for the cleaning of the contact pins which is indispensable in the automatic line in which flux is not cleaned.

As described above, the present invention can provide the board electrical-test method, the board electrical-test device and the cleaning tool used in the board electrical-test, by which it can be ensured that the elastic sheet is within the limit of use when it is used by a cleaning job effected once to securely clean the dirty material deposited to the extreme ends of the contact pins of the board electrical-test probes used in the board test device for executing tests including the incircuit test. In addition to the above, there is provided an advantage that the operation of the board manufacturing line in which the flux is not cleaned can be easily automated.

As many apparently widely different embodiments of the present invention can be made without departing from the spirit and scope thereof, it is to be understood that the invention is not limited to the specific embodiments thereof except as defined in the appended claims.

What is claimed is:

1. A board electrical-test method of executing the electrical test of boards, comprising:
    a conveying process for sequentially conveying the boards downstream one by one with parts mounted thereon facing outward;
    an electrical-test method of executing the electrical test by positioning the boards while they are conveyed in said conveying process and moving electrical-test probes having contact pins for the electrical test so that extreme ends of the contact pins come into direct contact with surfaces of the boards where the parts are mounted;
    and
    a cleaning process using an elastic sheet molded to include dispersed fine metal oxide particles in a specific weight percentage, said process including a first step of piercing the elastic sheet with the extreme ends of the contact pins and a second step of removing the extreme ends from the elastic sheet, with the elastic sheet removing and capturing solder flux from the extreme ends of the contact pins.

2. A board electrical-test method according to claim 1, further comprising a faulty board discharge process for discharging a board from the conveying path when the board is detected faulty in said electrical test method.

3. A board electrical-test method according to claim 1, wherein the cleaning process sequentially conveys the elastic sheet downward with its front surface facing outward every specific number of the boards as well as automatically discharging the elastic sheet from the conveying path after the cleaning is finished to make use of the moving action of the extreme ends of the contact pins.

4. A board electrical-test method according to claim 1, wherein a two-sided cleaning sheet composed of two elastic sheets bonded to both sides of a base sheet as a base portion and placed on a holder for accommodating the board is used to capture the dirty material deposited to the extreme ends of the contact pins from both sides of the cleaning sheet.

5. A board electrical-test method according to claim 1, wherein a one-side cleaning sheet composed of the elastic sheet bonded to one side of a base sheet as a base portion and placed on a holder for accommodating the board is used to capture the dirty material deposited to the extreme ends of the contact pins from one side of the cleaning sheet.

6. A board electrical-test method according to claim 5, wherein the faulty board is detected by using a resin substrate containing an electric conductive material in which carbon is contained or an electric conductive material including a glass epoxy substrate for printed wiring board to which metal foils are bonded and making a bonding layer for bonding elastic sheet or the base sheet electrically conductive.

7. A board electrical-test device for electrically testing boards, comprising:
    conveying means for sequentially conveying the boards downstream one by one with parts mounted thereon facing outward;
    electrical-test means for executing the electrical test by positioning the boards while they are conveyed in said conveying means and moving electrical-test probes having contact pins for the electrical test so that said extreme ends come into direct contact with surfaces of the boards where the parts are mounted;
    and
    cleaning means including an elastic sheet molded to include dispersed fine metal oxide particles in a specific weight percentage, said cleaning means capable of piercing said elastic sheet with said extreme ends of said contact pins and removing said extreme ends from said elastic sheet, with said elastic sheet removing and capturing solder flux from said extreme ends of said contact pins.

8. A board electrical-test device for electrically testing boards according to claim 8, further comprising a faulty board discharge means for discharging a board from the conveying path when the board is detected faulty in said electrical test means.

9. A board electrical-test device for electrically testing boards according to claim 7, wherein said cleaning means sequentially conveys said elastic sheet downward with its front surface facing every board as well as automatically discharges said elastic sheet from the conveying path after cleaning is finished.

10. A board electrical-test device for electrically testing boards according to claim 7, wherein a two-sided cleaning sheet composed of two elastic sheets bonded to both sides of a base sheet as a base portion and placed on a holder for accommodating the board is used to capture the dirty material deposited at said extreme ends of said contact pins from both sides of said cleaning sheet.

11. A board electrical-test device for electrically testing boards according to claim 10, wherein the faulty board is detected by using a resin substrate containing an electric conductive material in which carbon is contained or an electric conductive material including a glass epoxy substrate for printed wiring board to which metal foils are bonded and making a bonding layer for bonding said elastic sheet or the base sheet electrically conductive.

12. A board electrical-test device for electrically testing boards according to claim 7, wherein a one-side cleaning sheet composed of said elastic sheet bonded to one side of a base sheet as a base portion and placed on a holder for accommodating the board is used to capture the dirty material deposited to said extreme ends of said contact pins from one side of said cleaning sheet.

13. A board electrical-test device for electrically testing boards according to claim 12, wherein the faulty board is detected by using a resin substrate containing an electric conductive material in which carbon is contained or an electric conductive material including a glass epoxy substrate for printed wiring board to which metal foils are bonded and making a bonding layer for bonding said elastic sheet or the base sheet electrically conductive.

14. A board electrical-test method of executing electrical-tests of boards including an incircuit test, comprising:

a conveying process for sequentially conveying the boards downstream one by one with parts mounted thereon facing outward;

an electrical-test method of executing the electrical test by positioning the boards while they are conveyed in said conveying process and moving electrical-test probes having contact pins for the electrical test so that extreme ends of the contact pins come into direct contact with surfaces of the boards where the parts are mounted;

a cleaning process using an elastic sheet molded to include dispersed fine metal oxide particles in a specific weight percentage, said process including a first step of piercing the elastic sheet with the extreme ends of the contact pins and a second step of removing the extreme ends from the elastic sheet, with the elastic sheet removing and capturing solder flux from the extreme ends of the contact pins; and a measuring process for measuring the number of executions of the electrical-test method to execute said cleaning process every specific number of executions of the electrical-test method.

15. A board electrical-test method according to claim 14, further comprising:

a faulty board discharge process for discharging a board from the conveying path when the board is detected faulty in said electrical test method;

a measuring process for measuring the number of executions of the electrical test method to execute said cleaning process every specific number of executions of the electrical test method; and an alarm process for giving an alarm when the number of executions becomes a specific value.

16. A board electrical-test method according to claim 14, further comprising an elastic sheet conveying process for supplying said elastic sheet onto the conveying path when the predetermined number of times is measured by said measuring process.

17. A board electrical-test method according to claim 14, wherein a two-sided cleaning sheet composed of the elastic sheets bonded to both sides of a base sheet as a base portion and placed on a holder for accommodating the board is used to capture the dirty material deposited to the extreme ends of the contact pins from both sides of the cleaning sheet.

18. A board electrical-test method according to claim 14, wherein a one sided cleaning sheet composed of the elastic sheet bonded to one side of a base sheet as a base portion and placed on a holder for accommodating the board is used to capture the dirty material deposited to the extreme ends of the contact pins from one side of the cleaning sheet.

19. A board electrical-test method according to claim 18, wherein the faulty board is detected by using a resin substrate containing an electric conductive material in which carbon is contained or an electric conductive material including a glass epoxy substrate for printed wiring board to which metal foils are bonded and making a bonding layer for bonding the elastic sheet or the base sheet electrically conductive.

20. A board electrical-test device for executing electrical-tests of boards including an incircuit test, comprising:

conveying means for sequentially conveying the boards downstream one by one with parts mounted thereon facing outward;

electrical-test means for executing the electrical test by positioning the boards while they are conveyed in said conveying means and moving electrical-test probes including contact pins for the electrical test so that extreme ends of said contact pins of said probes come into direct contact with the surfaces of the boards where the parts are mounted;

cleaning means including an elastic sheet molded to include dispersed fine metal oxide particles in a specific weight percentage, said cleaning means capable of piercing said elastic sheet with said extreme ends of said contact pins and removing said extreme ends from said elastic sheet, with said elastic sheet removing and capturing solder flux from said extreme ends of said contact pins; and measuring means for measuring the number of executions of the electrical test to capture dirty material every specific number of executions of said electrical test means.

21. A board electrical-test device according to claim 20, further comprising:

measuring means for measuring the number of executions of the electrical test to capture the dirty material every specific number of executions of said electrical-test means; and alarm means for giving an alarm when the number of executions becomes a specific value.

22. A board electrical-test device for executing electrical-tests of boards including an incircuit test, comprising:

conveying means for sequentially conveying the boards downstream one by one with parts mounted thereon facing outward;

electrical-test means for executing the electrical test by positioning the boards while they are conveyed in said conveying means and moving electrical-test probes having contact pins for the electrical test so that extreme ends of said contact pins come into direct contact with surfaces of the boards where the parts are mounted;

a faulty board discharge process for discharging a board from the conveying path when the board is detected faulty in said electrical test;

cleaning means including an elastic sheet molded to include dispersed fine metal oxide particles in a specific weight percentage, said cleaning means capable of piercing said elastic sheet with said extreme ends of said contact pins and removing said extreme ends from said elastic sheet, with said elastic sheet removing and capturing solder flux from said extreme ends of said contact pins;

measuring means for measuring the number of executions of the electrical test to capture dirty material every specific number of executions of said electrical test means; and elastic sheet conveying means for supplying said elastic sheet onto the conveying path when the predetermined number of times is measured by said measuring process.

* * * * *

UNITED STATES PATENT AND TRADEMARK OFFICE
CERTIFICATE OF CORRECTION

PATENT NO.   : 6,118,289
DATED        : September 12, 2000
INVENTOR(S)  : Masashi Kitani, et al.

It is certified that error appears in the above-identified patent and that said Letters Patent is hereby corrected as shown below:

Item [56] References Cited:
FOREIGN PATENT DOCUMENTS, insert
--     7-130638     5/1995     Japan
       7-092190     4/1995     Japan --.

Signed and Sealed this

Sixth Day of November, 2001

Attest:

NICHOLAS P. GODICI
Attesting Officer     Acting Director of the United States Patent and Trademark Office